(12) United States Patent
Diebel et al.

(10) Patent No.: US 10,085,531 B2
(45) Date of Patent: Oct. 2, 2018

(54) CASE FOR ELECTRONIC TABLET

(71) Applicant: Incase Designs Corp., Chino, CA (US)

(72) Inventors: Markus Diebel, San Francisco, CA (US); Hyun Hong, Los Angeles, CA (US)

(73) Assignee: Incase Designs Corp., Los Angeles, CA (US)

( * ) Notice: Subject to any disclaimer, the term of this patent is extended or adjusted under 35 U.S.C. 154(b) by 0 days.

(21) Appl. No.: 15/472,202

(22) Filed: Mar. 28, 2017

(65) Prior Publication Data

US 2017/0196329 A1 Jul. 13, 2017

Related U.S. Application Data

(60) Continuation of application No. 14/532,994, filed on Nov. 4, 2014, now Pat. No. 9,603,425, which is a division of application No. 13/682,627, filed on Nov. 20, 2012, now Pat. No. 8,875,879, which is a continuation of application No. 13/069,207, filed on Mar. 22, 2011, now Pat. No. 8,312,991, which is a continuation of application No. 12/892,736, filed on Sep. 28, 2010, now Pat. No. 8,328,008.

(60) Provisional application No. 61/372,450, filed on Aug. 10, 2010, provisional application No. 61/382,472, filed on Sep. 13, 2010.

(51) Int. Cl.
*A45C 11/00* (2006.01)
*G06F 1/16* (2006.01)
*A45C 13/00* (2006.01)

(52) U.S. Cl.
CPC ............ *A45C 11/00* (2013.01); *A45C 13/005* (2013.01); *G06F 1/1626* (2013.01); *A45C 2011/003* (2013.01); *A45C 2200/15* (2013.01); *G06F 2200/1633* (2013.01)

(58) Field of Classification Search
CPC . A45C 11/00; A45C 13/005; A45C 2011/003; A45C 2200/15; A45C 2013/0258; G06F 1/1626; G06F 2200/1633; H04M 1/04; H05K 13/00
USPC .......... 206/320, 45.2, 305, 45.23–45.25, 701
See application file for complete search history.

(56) References Cited

U.S. PATENT DOCUMENTS

| | | |
|---|---|---|
| 1,347,839 A | 7/1920 | Coons |
| 1,659,395 A | 2/1928 | Douglas |
| 4,515,272 A | 5/1985 | Newhouse |
| D284,372 S | 6/1986 | Carpenter |
| D312,534 S | 12/1990 | Nelson et al. |
| D322,719 S | 12/1991 | Jayez |
| 5,360,108 A | 11/1994 | Alagia |
| 5,368,159 A | 11/1994 | Doria |
| 5,383,091 A | 1/1995 | Snell |
| D357,918 S | 5/1995 | Doria |

(Continued)

OTHER PUBLICATIONS

Apple iPad Case Product Reference, Mar. 15, 2010, 12 pages.
(Continued)

*Primary Examiner* — Chun Cheung
(74) *Attorney, Agent, or Firm* — Manatt, Phelps & Phillips, LLP

(57) ABSTRACT

A case incorporates a built-in stand for an electronic device, such as an electronic tablet computer, which the case houses. The case protects the electronic device and allows a user to view and access the device without removing it from the case. The built-in stand is adjustable and allows for multiple viewing angles.

18 Claims, 23 Drawing Sheets

(56) References Cited

U.S. PATENT DOCUMENTS

| | | |
|---|---|---|
| 5,439,101 A | 8/1995 | Brink et al. |
| D372,896 S | 8/1996 | Nagele et al. |
| 5,586,002 A | 12/1996 | Notarianni |
| 5,604,050 A | 2/1997 | Brunette et al. |
| 5,610,979 A | 3/1997 | Yu |
| 5,708,707 A | 1/1998 | Halttunen et al. |
| 5,711,013 A | 1/1998 | Collett et al. |
| D392,248 S | 3/1998 | Johansson |
| D392,939 S | 3/1998 | Finke-Anlauff |
| D400,495 S | 11/1998 | Deslyper et al. |
| 5,864,766 A | 1/1999 | Chiang |
| D405,801 S | 2/1999 | Nagele et al. |
| 5,887,723 A | 3/1999 | Myles et al. |
| 5,896,277 A | 4/1999 | Leon et al. |
| 5,996,778 A | 12/1999 | Shih |
| 6,043,626 A | 3/2000 | Snyder et al. |
| 6,184,654 B1 | 2/2001 | Bachner, III et al. |
| 6,201,867 B1 | 3/2001 | Koike |
| 6,317,313 B1 | 11/2001 | Mosgrove et al. |
| 6,324,380 B1 | 11/2001 | Kiuchi et al. |
| D460,411 S | 7/2002 | Wang |
| D469,427 S | 1/2003 | Ma et al. |
| 6,538,413 B1 | 3/2003 | Beard et al. |
| 6,555,990 B1 | 4/2003 | Yang |
| 6,614,722 B2 | 9/2003 | Polany et al. |
| 6,626,362 B1 | 9/2003 | Steiner et al. |
| D484,874 S | 1/2004 | Chang et al. |
| 6,763,942 B1 | 7/2004 | Yeh |
| 6,772,879 B1 | 8/2004 | Domotor |
| 6,829,140 B2 | 12/2004 | Shimano et al. |
| D506,612 S | 6/2005 | Rosa et al. |
| 6,929,140 B2 | 8/2005 | Rose |
| 6,982,866 B2 | 1/2006 | Ghosh |
| 6,992,461 B2 | 1/2006 | Liang et al. |
| 7,050,841 B1 | 5/2006 | Onda |
| 7,166,987 B2 | 1/2007 | Lee et al. |
| D537,063 S | 2/2007 | Kim et al. |
| 7,194,291 B2 | 3/2007 | Peng |
| D540,539 S | 4/2007 | Gutierrez |
| D543,541 S | 5/2007 | Chung et al. |
| D547,056 S | 7/2007 | Griffin et al. |
| D547,057 S | 7/2007 | Griffin et al. |
| D551,252 S | 9/2007 | Andre et al. |
| D551,856 S | 10/2007 | Ko et al. |
| D556,681 S | 12/2007 | Kim |
| D557,205 S | 12/2007 | Kim |
| D558,972 S | 1/2008 | Oh |
| D558,973 S | 1/2008 | Hussaini et al. |
| 7,318,521 B2 | 1/2008 | Lau |
| D561,092 S | 2/2008 | Kim |
| D563,093 S | 3/2008 | Nussberger |
| 7,400,917 B2 | 7/2008 | Wood et al. |
| D574,819 S | 8/2008 | Andre et al. |
| D575,056 S | 8/2008 | Tan |
| 7,428,427 B2 | 9/2008 | Brunstrom et al. |
| D581,151 S | 11/2008 | Aipa |
| D582,149 S | 12/2008 | Tan |
| 7,479,759 B2 | 1/2009 | Vilanov et al. |
| D587,896 S | 3/2009 | Aipa |
| D597,089 S | 7/2009 | Khan et al. |
| D600,699 S | 9/2009 | Johnston et al. |
| 7,584,841 B2 | 9/2009 | Chan et al. |
| D603,603 S | 11/2009 | Laine et al. |
| 7,612,997 B1 | 11/2009 | Diebel et al. |
| D606,529 S | 12/2009 | Ferrari et al. |
| 7,643,274 B2 | 1/2010 | Bekele |
| D609,228 S | 2/2010 | Ferrari et al. |
| D609,463 S | 2/2010 | Bullen |
| D610,807 S | 3/2010 | Bau |
| D611,042 S | 3/2010 | Ferrari et al. |
| D617,787 S | 6/2010 | Richardson et al. |
| 7,735,644 B2 | 6/2010 | Sirichai et al. |
| 7,909,234 B2 | 3/2011 | Maistrellis |
| 2002/0147035 A1 | 10/2002 | Su |
| 2003/0096642 A1 | 5/2003 | Bessa et al. |
| 2003/0218445 A1 | 11/2003 | Behar |
| 2004/0097256 A1 | 5/2004 | Kujawski |
| 2004/0114315 A1 | 6/2004 | Anlauff |
| 2005/0090301 A1 | 4/2005 | Lange et al. |
| 2005/0105264 A1* | 5/2005 | Chen .................. G06F 1/1616 361/679.27 |
| 2005/0231159 A1 | 10/2005 | Jones et al. |
| 2005/0248312 A1 | 11/2005 | Cao et al. |
| 2006/0007645 A1 | 1/2006 | Chen et al. |
| 2006/0058073 A1 | 3/2006 | Kim |
| 2006/0099999 A1 | 5/2006 | Park |
| 2007/0152633 A1 | 7/2007 | Lee |
| 2007/0167190 A1 | 7/2007 | Moosavi et al. |
| 2007/0236180 A1 | 10/2007 | Rodgers |
| 2007/0261978 A1 | 11/2007 | Sanderson |
| 2008/0007214 A1 | 1/2008 | Cheng |
| 2008/0096620 A1 | 4/2008 | Lee et al. |
| 2008/0108395 A1 | 5/2008 | Lee et al. |
| 2008/0123287 A1 | 5/2008 | Rossell et al. |
| 2008/0132289 A1 | 6/2008 | Wood et al. |
| 2008/0142518 A1 | 6/2008 | Maistrellis |
| 2008/0237432 A1 | 10/2008 | Patterson |
| 2008/0302687 A1 | 12/2008 | Sirichai et al. |
| 2009/0017883 A1 | 1/2009 | Lin |
| 2009/0111543 A1 | 4/2009 | Tai et al. |
| 2009/0159763 A1 | 6/2009 | Kim |
| 2009/0194209 A1 | 8/2009 | De Filippis et al. |
| 2009/0205983 A1 | 8/2009 | Estlander |
| 2010/0048267 A1 | 2/2010 | Lin |
| 2010/0093412 A1 | 4/2010 | Serra et al. |
| 2010/0122924 A1 | 5/2010 | Andrews |
| 2010/0294909 A1 | 11/2010 | Hauser et al. |
| 2011/0297564 A1 | 12/2011 | Kim et al. |
| 2011/0297566 A1 | 12/2011 | Gallagher et al. |
| 2012/0012483 A1 | 1/2012 | Fan |

OTHER PUBLICATIONS

"Targus Truss Case and Stand for iPad Product Reference," Jun. 22, 2010, 20 pages.

"Acase Leather Flip Book Jacket Product Reference," Apr. 28, 2010, 15 pages.

Seidio, Inc., Innocase for iPhone, available at http://www.seidioonline.com, Jan. 2008 (accessed Feb. 6, 2008).

Review of BoxWave FlexiSkin for Apple iPhone, available at http://www.ilounge.com, Jul. 6, 2007 (accessed Feb. 6, 2008).

Review of DLO Jam Jacket for iPhone, available at http://www.ilounge.com, Jul. 6, 2007 (accessed Feb. 6, 2008).

Review of Incipio dermaSHOT Silicone Case for Apple iPhone, available at http://www.ilounge.com, Jul. 6, 2007 (accessed Feb. 6, 2008).

Review of Marware SportGrip Smooth Silicone Protection for iPhone, available at http://www.ilounge.com, Jul. 6, 2007 (accessed Feb. 6, 2008).

Review of Speck SkinTight 2-Pack for iPhone, available at http://www.ilounge.com, Jul. 6, 2007 (accessed Feb. 6, 2008).

Review of Speck ToughSkin for iPhone, available at http://www.ilounge.com, Jul. 6, 2007 (accessed Feb. 6, 2008).

Review of Belkin Acrylic Case for iPhone, available at http://www.ilounge.com, Jul. 7, 2007 (accessed Feb. 6, 2008).

Review of Belkin Sport Armband for iPhone, available at http://www.ilounge.com, Jul. 19, 2007 (accessed Feb. 6, 2008).

iSkin, Inc., revo for iPhone, available at http://www.iskin.com, announced Jul. 25, 2007 (accessed Feb. 6, 2008).

The Agent 18 Eco iPhone Shield Case Review, available at http://blog.monkeykit.com, Sep. 14, 2007 (accessed Feb. 6, 2008).

Review of Artwizz SeeJacket Crystal for Apple iPhone, available at http://www.ilounge.com, Nov. 29, 2007 (accessed Feb. 6, 2008).

Review of Agent 18 iPhone Shield, available at http://www.ilounge.com, Jan. 4, 2008 (accessed Feb. 6, 2008).

Review of Belkin Clear Case for iPhone, available at http://www.ilounge.com, Jan. 4, 2008 (accessed Feb. 6, 2008).

Review of CoverCase SlimSkin Silicon Case for iPhone, available at http://www.ilounge.com, Jan. 10, 2008 (accessed Feb. 6, 2008).

(56) References Cited

OTHER PUBLICATIONS

Agent 18, Eco iPhone Shield, available at http://www.agent18.com, Sep. 2007 (accessed Feb. 6, 2008).
Agent 18, iPhone Shield, available at http://www.agent18.com, Dec. 2007 (accessed Feb. 6, 2008).
Seidlo, Inc., Super Slim Rubberized Hard Case for iPhone, available at http://www.seidioonline.com, Sep. 2007 (accessed Feb. 6, 2008).
Mophie Juice Pack iPhone 1G Product Reference, May 1, 2008, 22 pages.
Mophie Juice Pack iPhone 3G Product Reference, Aug. 4, 2008, 33 pages.
"Cheap DIY iPhone External Battery," Michael Fisher's Web Log, Jul. 22, 2008, available at <http://fastdad.wordpress.com/2008/07/22/cheap-diy-iphone-external-battery/>, retrieved May 12, 2009, 10 pages.
Rees, Dave, "Richard Solo Backup Battery for iPhone/iPod Review," Gadgeteer, Jun. 16, 2008, available at <http://the-gadgeteer.com/2008/06/16/richard_solo_backup_battery_for_iphone_ipod/>, retrieved May 12, 2009, 8 pages.
Horowitz, Jeremy, "Kensington Mini Battery Pack and Charger for iPhone and iPod," iLounge, May 16, 2008, available at <http://www.ilounge.com/index.php/reviews/entry/kensington-mini-battery-pack-and-charger-for-iphone-and-ipod/>, retrieved May 12, 2009, 3 pages.
"Mini Battery Pack and Charger for iPhone and iPod," Kensington, May 1, 2008, available at <http://files.acco.com/KENSINGTON/K33442US/K33442US-usconsumer.pdf>, retrieved May 12, 2009, 1 page.
Rafferty, Sven, "Mybat External Battery for iPhone and iPod," SvenOnTech, May 18, 2008, available at <http://svenontech.com/reviews/?p=74>, retrieved May 12, 2009, 4 pages.
Coldewey, Devin, "Combination iPhone Battery Pack and Flash From FastMac," CrunchGear, Nov. 4, 2008, available at <http://www.crunchgear.com/2008/11/04/combination-iphone-battery-pack-and-flash-from-fastmac/>, retrieved May 12, 2009, 3 pages.
Horowitz, Jeremy, "iLuv i603/i604 Rechargeable Lithium Polymer Batteries with Silicone Skin," iLounge, Jun. 27, 2006, available at <http://www.ilounge.com/index.php/reviews/entry/iluv-i603-rechargeable-lithium-polymer-battery-with-silicone-skin>, retrieved May 12, 2009, 3 pages.
Gamet, Jeff, "Apple iPad Case," the Mac Observer, Apr. 30, 2010, available at <http://www.madobserver.com/tmo/review/apple_ipad_case/>, retrieved Sep. 13, 2010, 3 pages.
"Apple's iPad Case Design is now Registered with Patent Office," Patently Apple, Aug. 2, 2010, available at <http://www.patentlyapple.com/patently-apple/2010/08/apples-ipad-case-design-is-now-registered-with-patent-office.html#more>, retrieved Aug. 27, 2010, 2 pages.

* cited by examiner

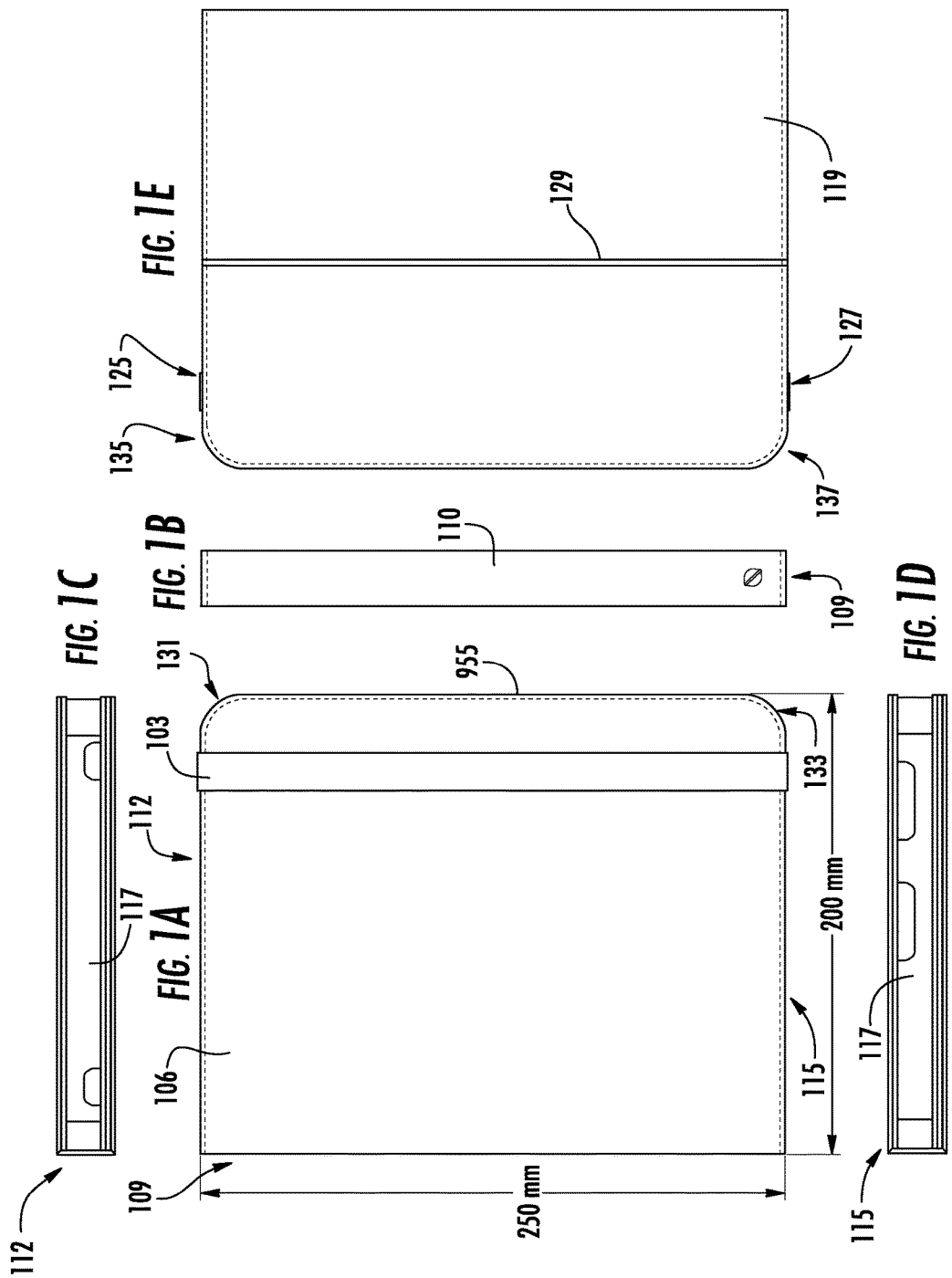

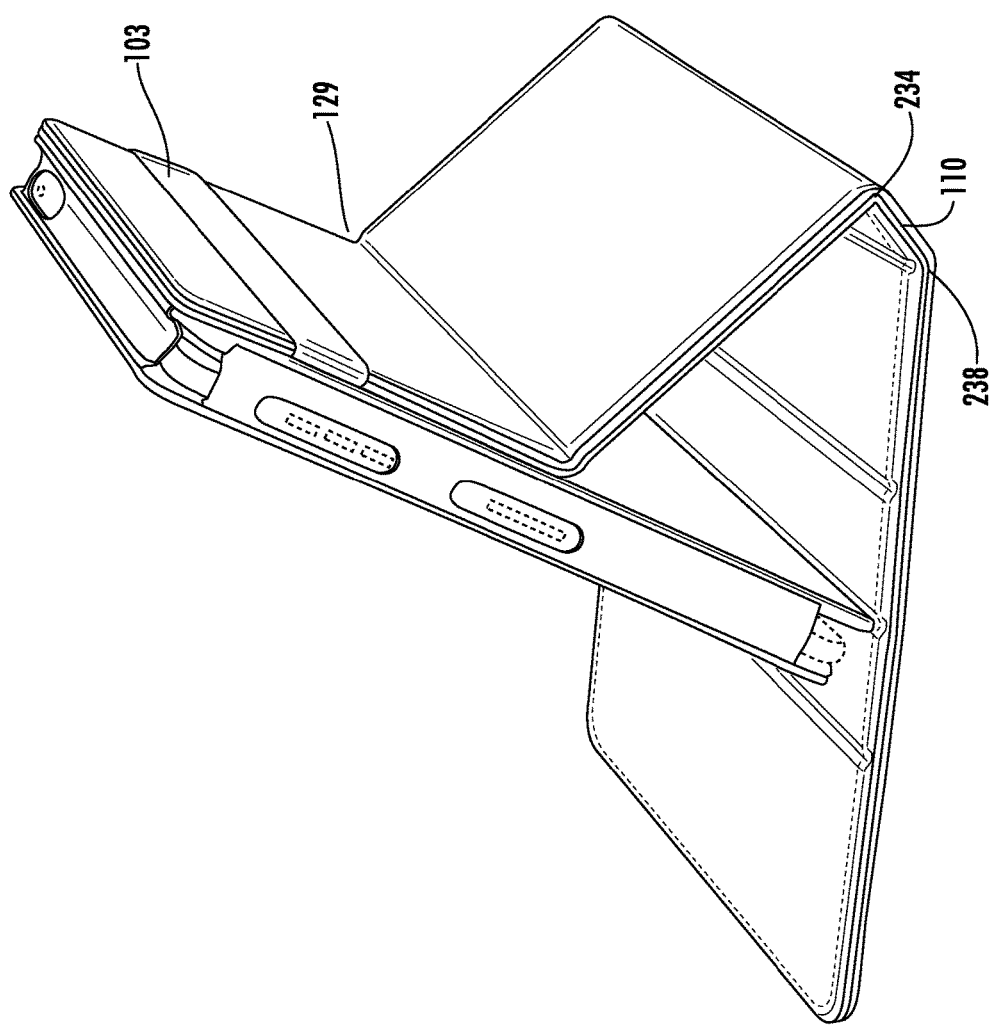

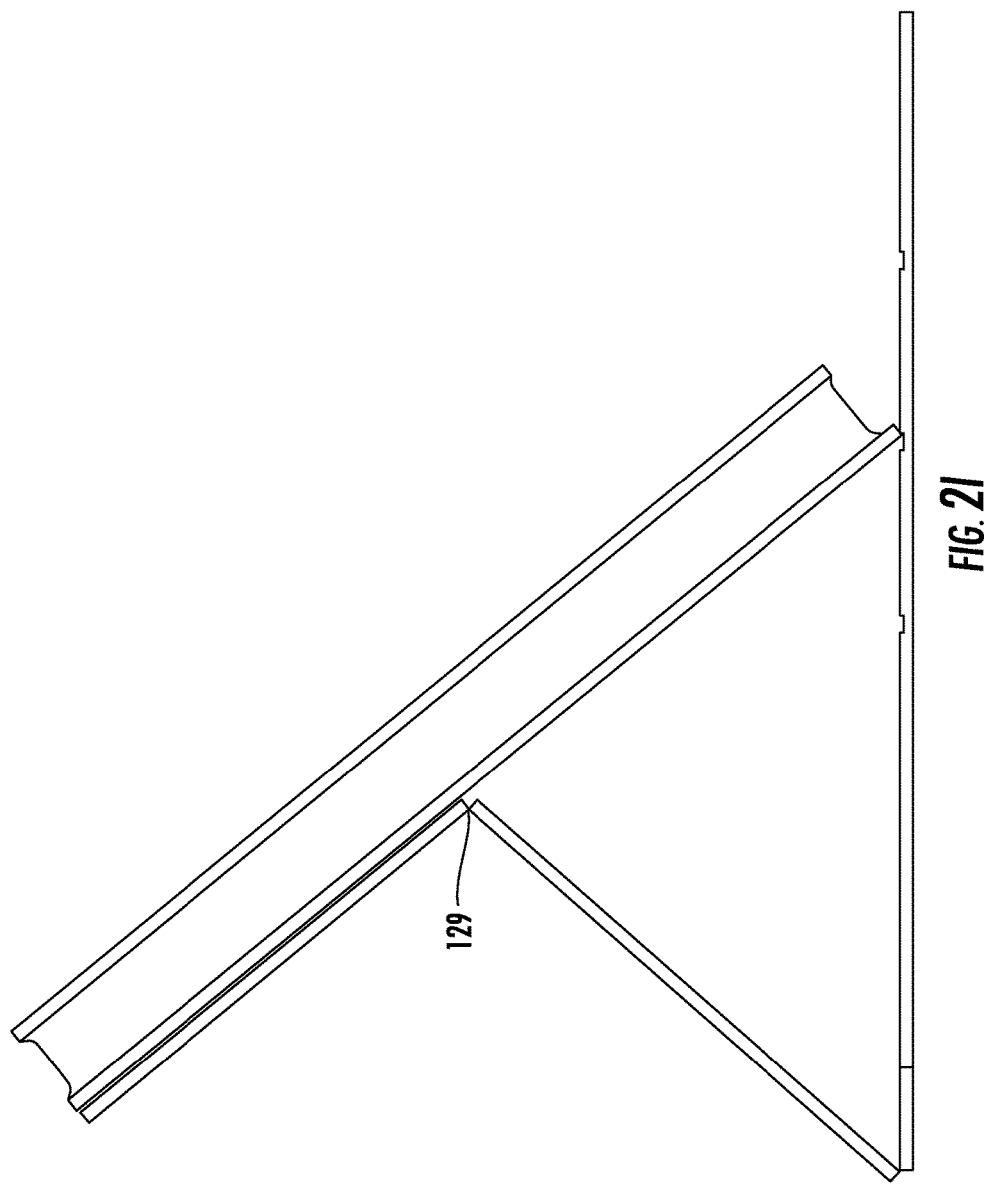

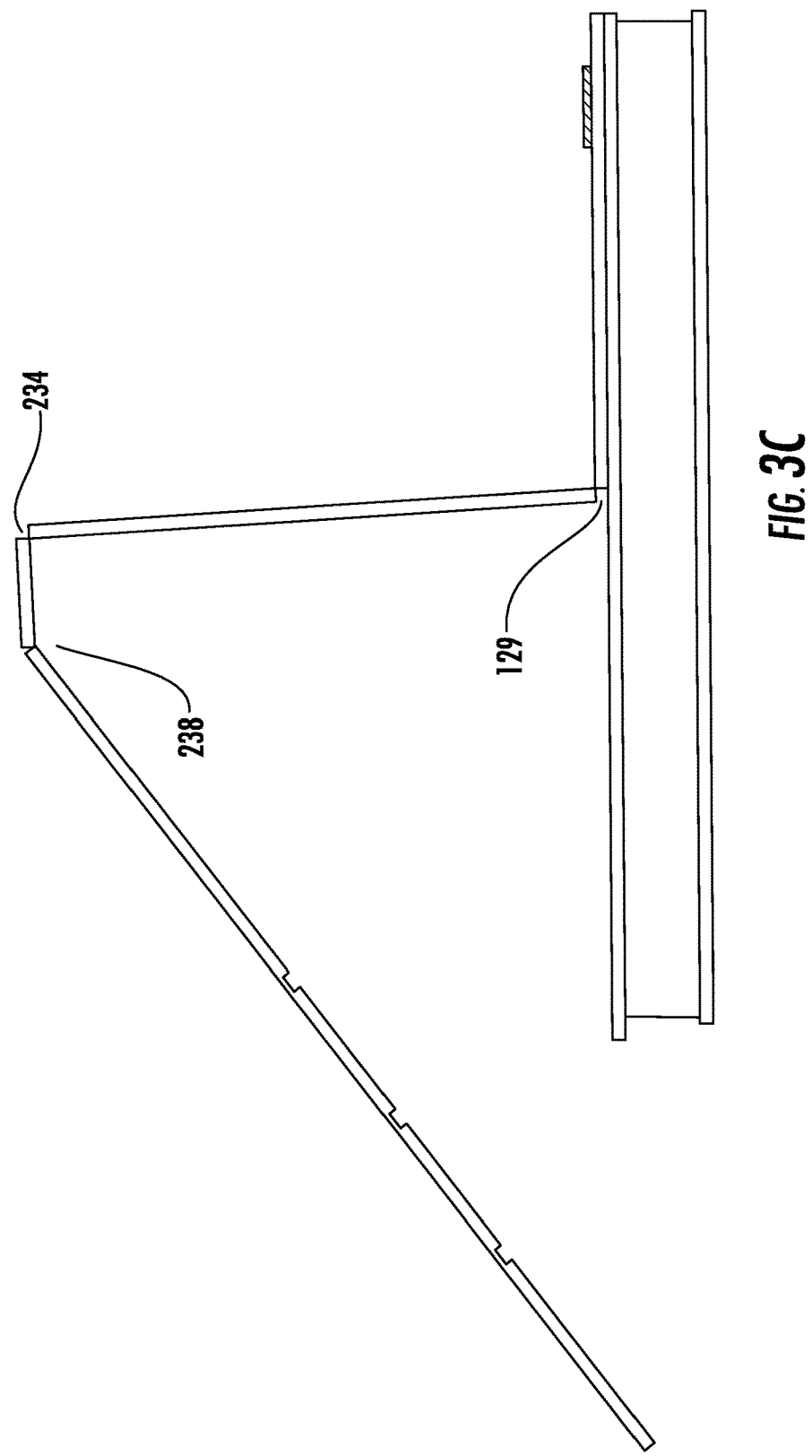

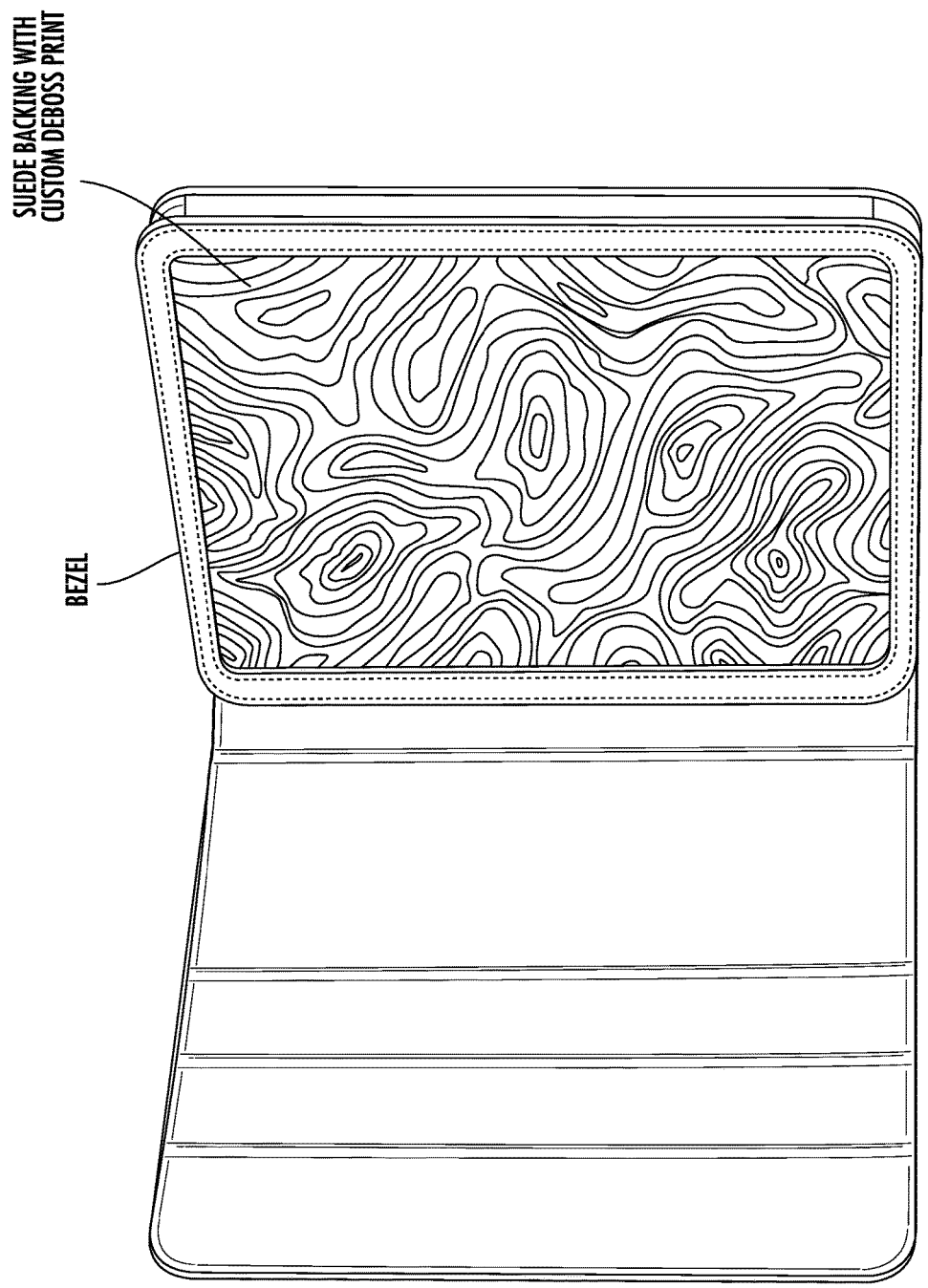

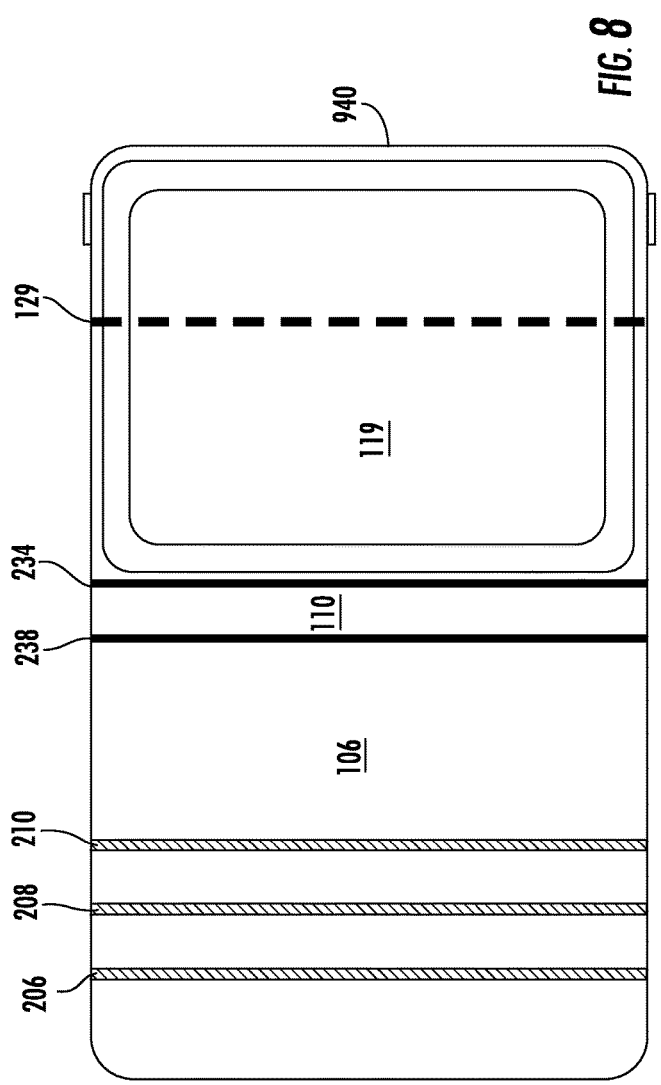
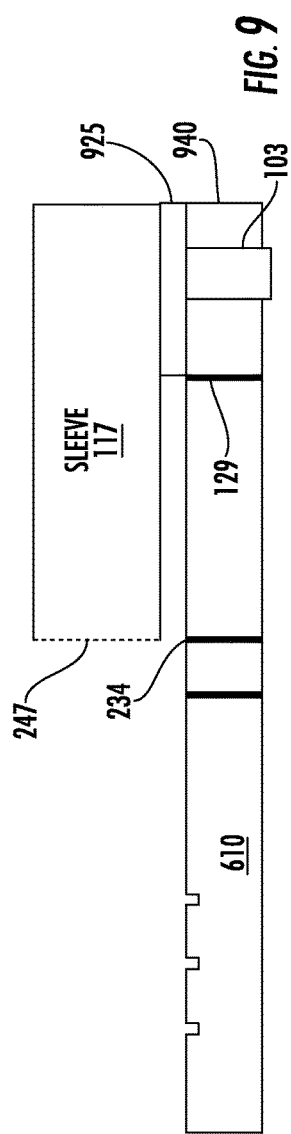
FIG. 8
FIG. 9

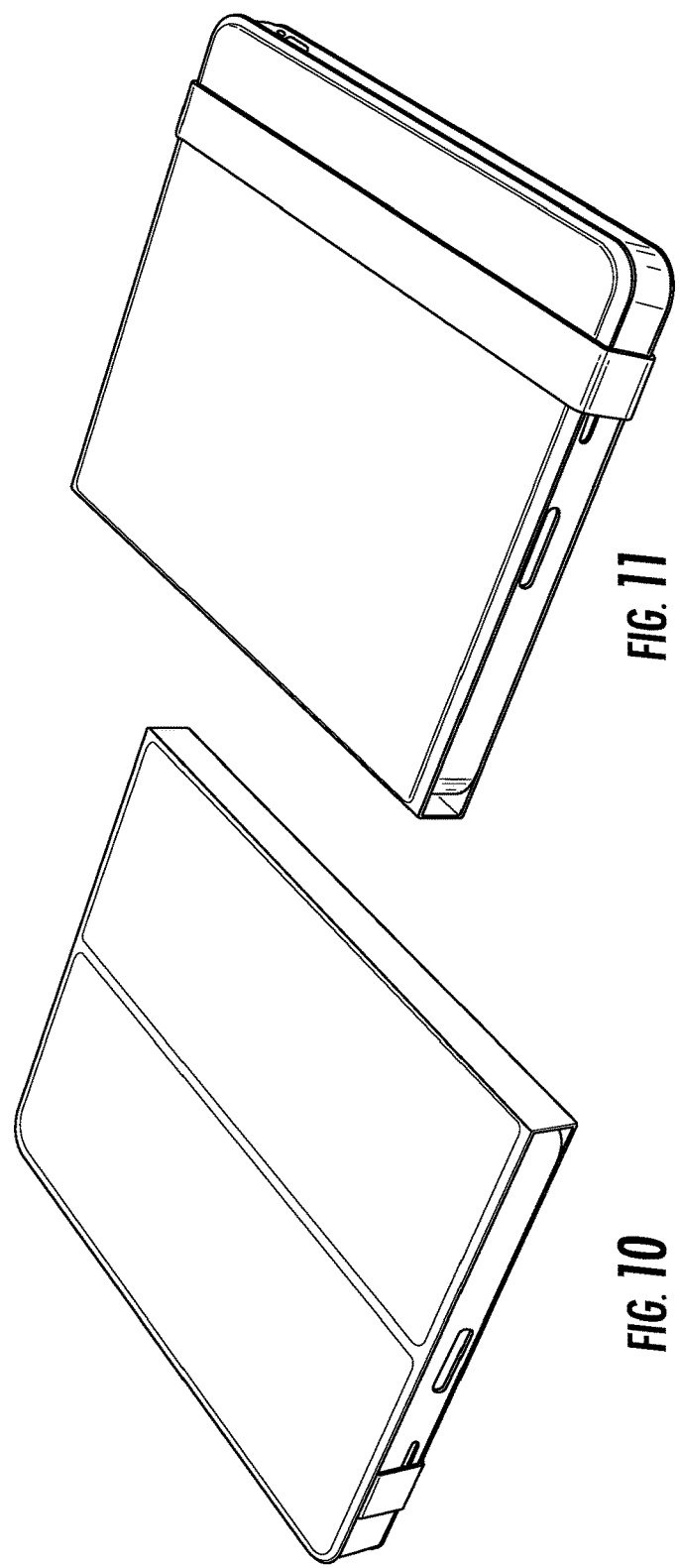

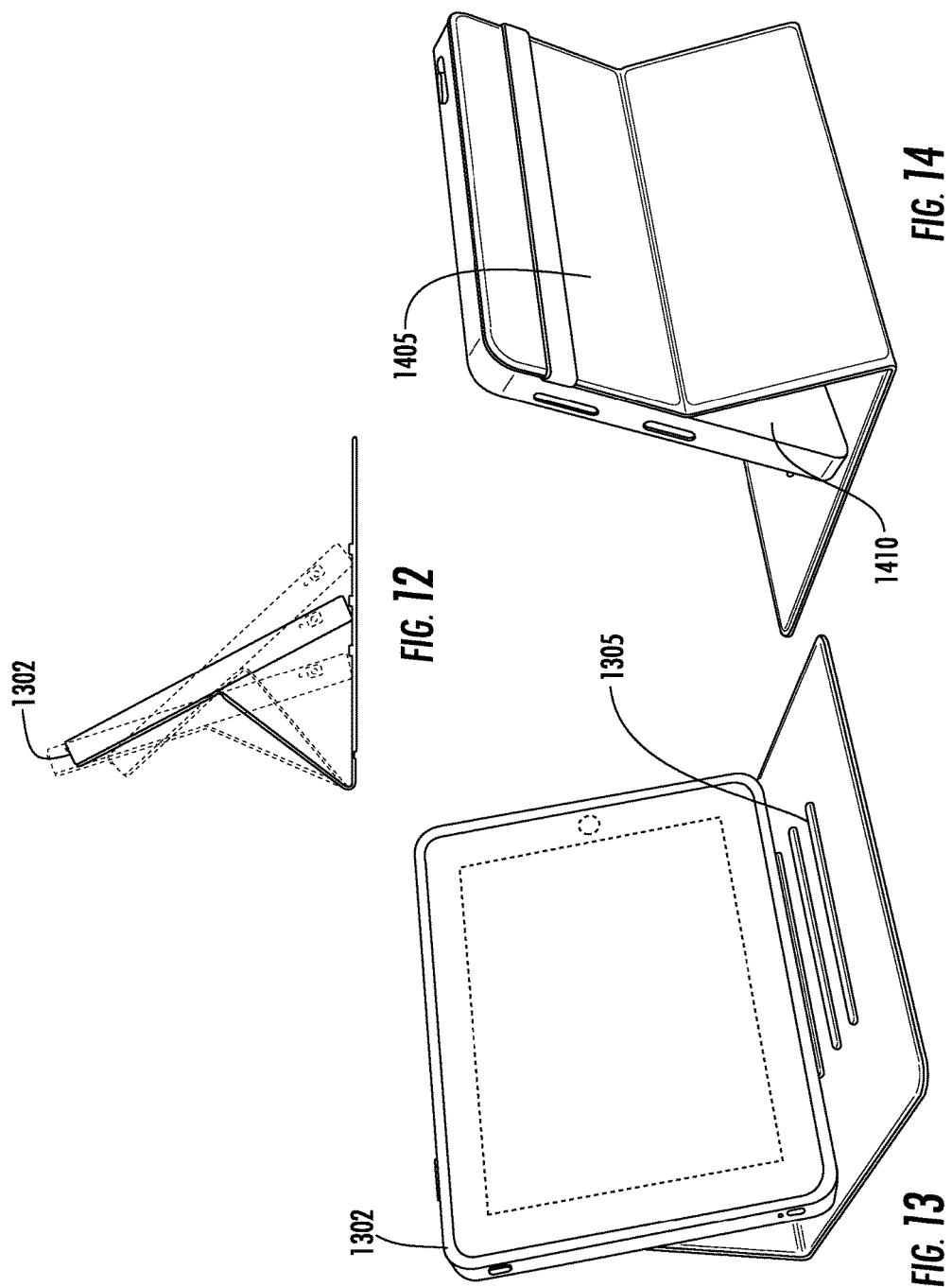

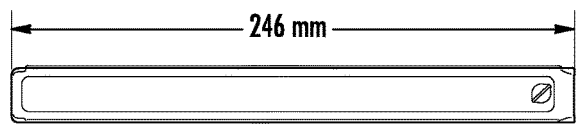
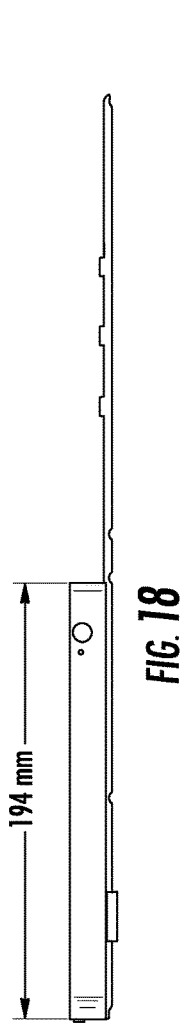
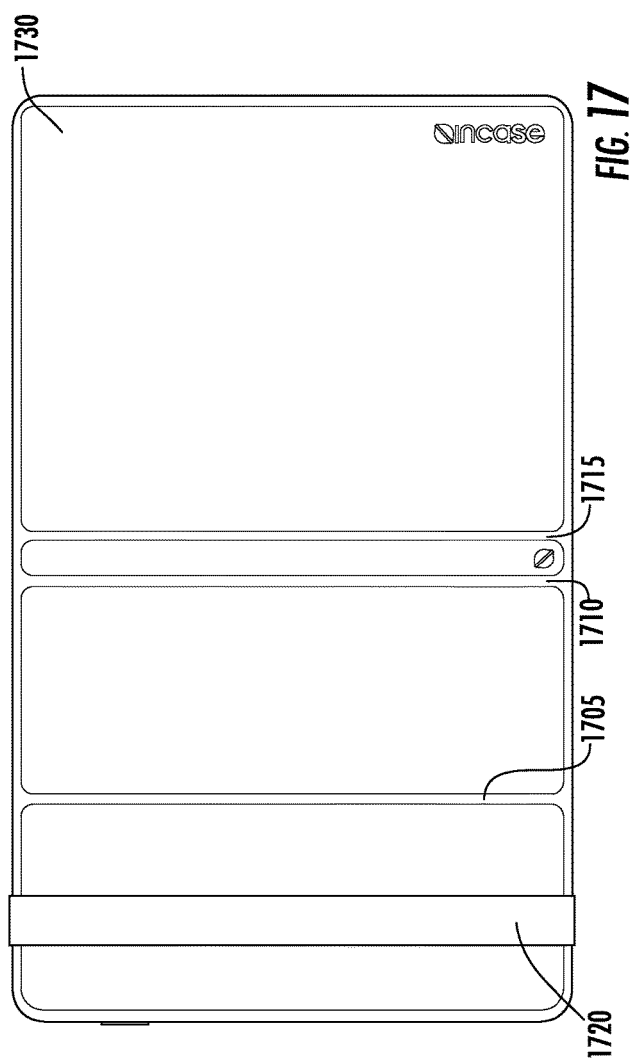
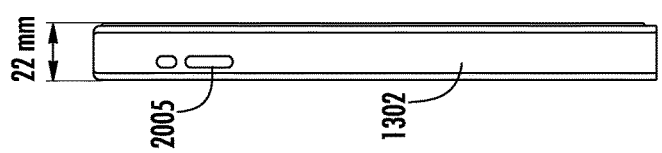

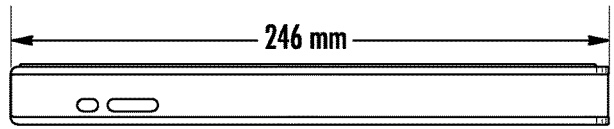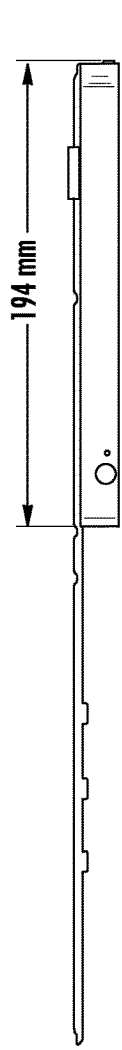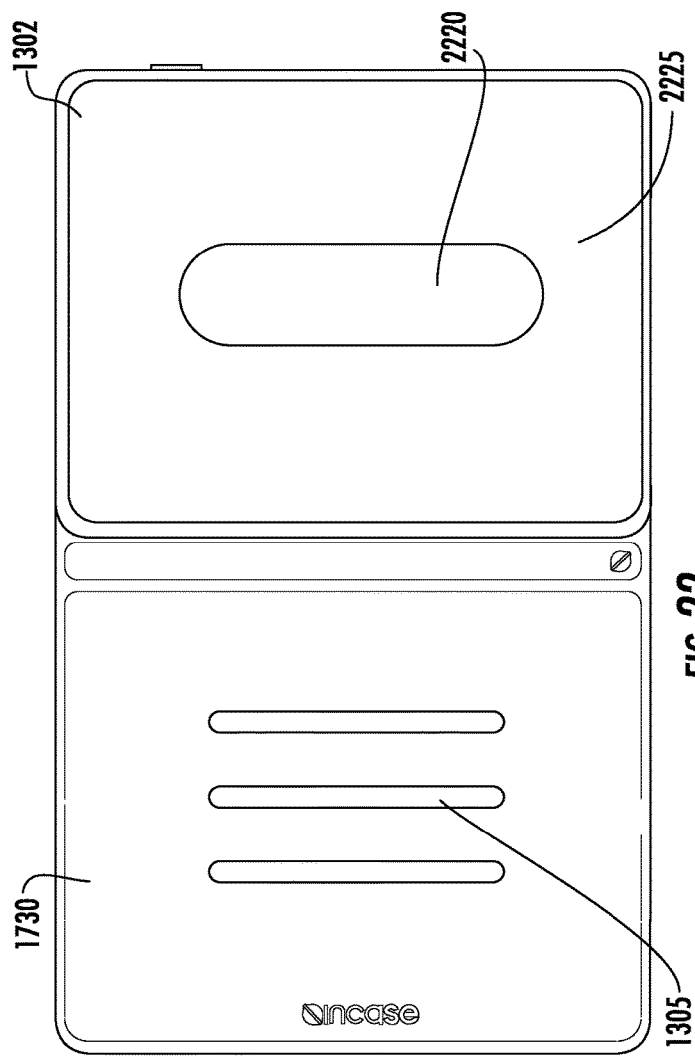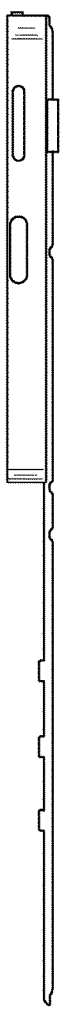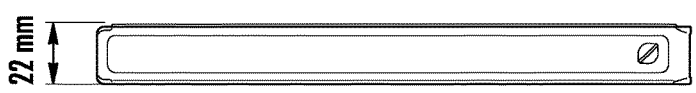

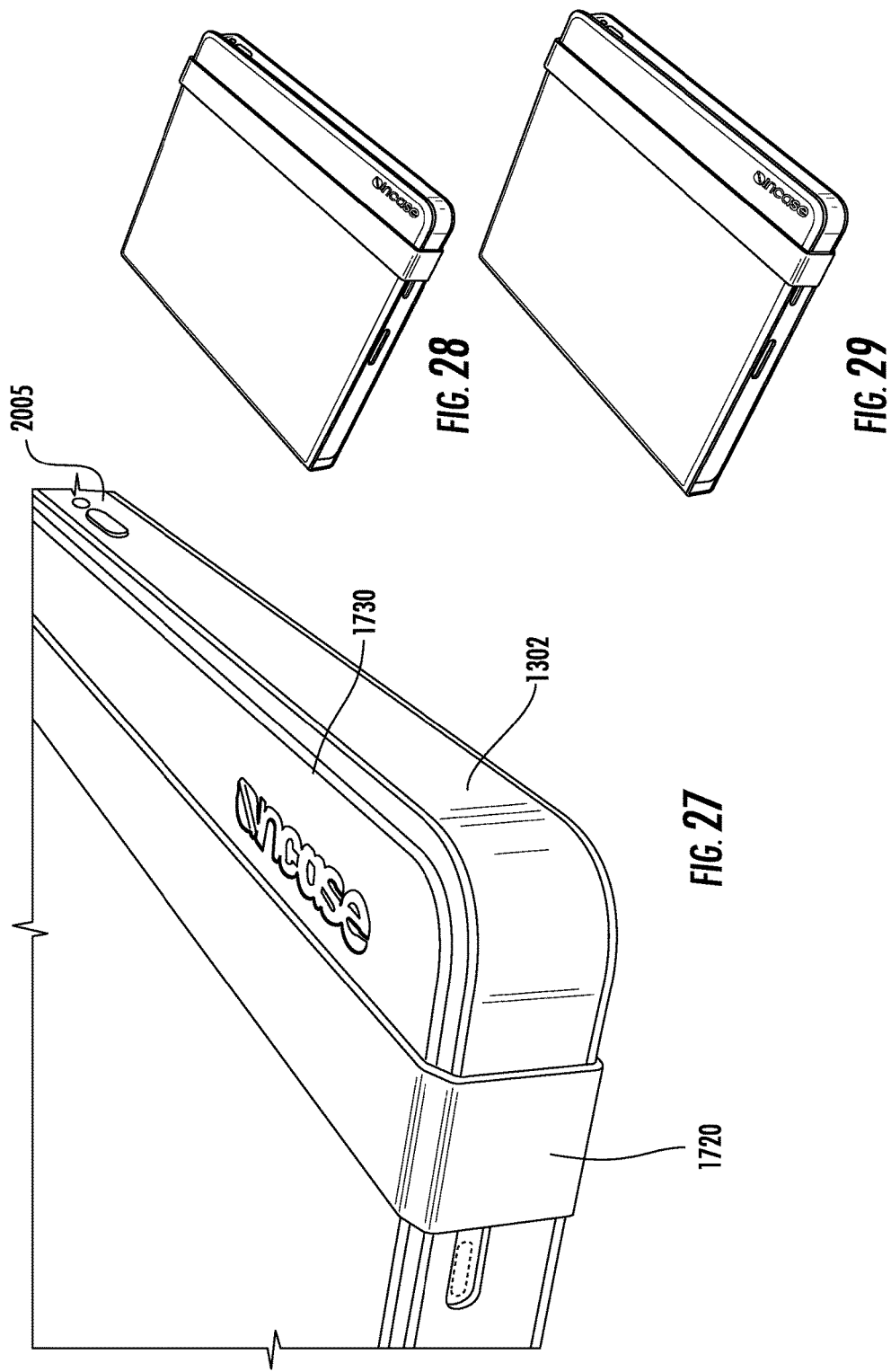

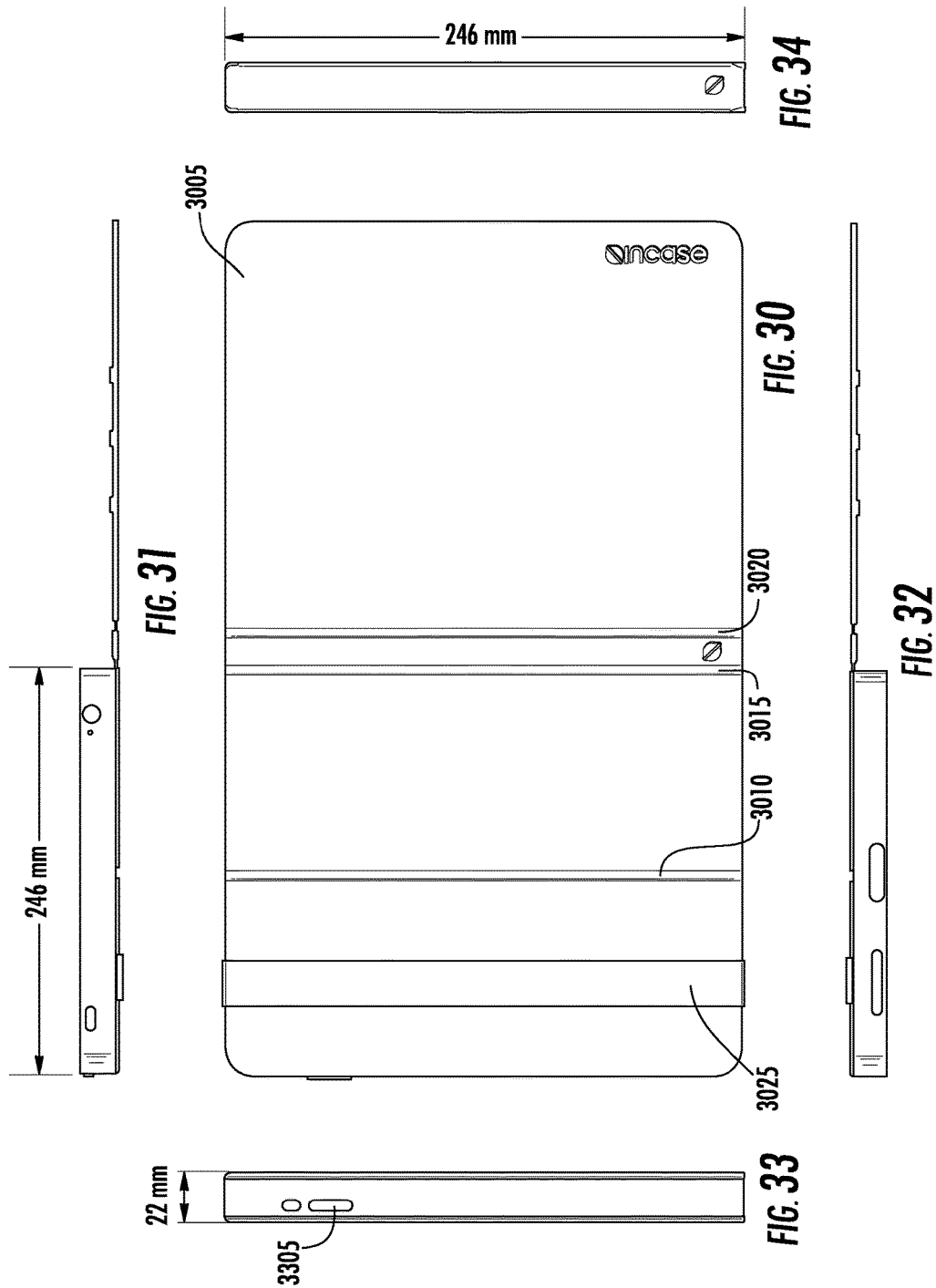

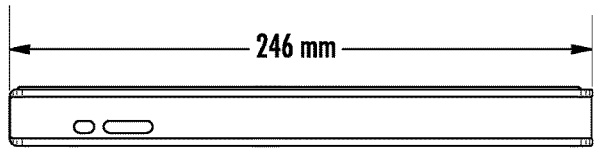
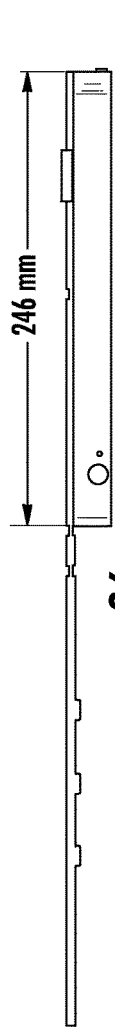
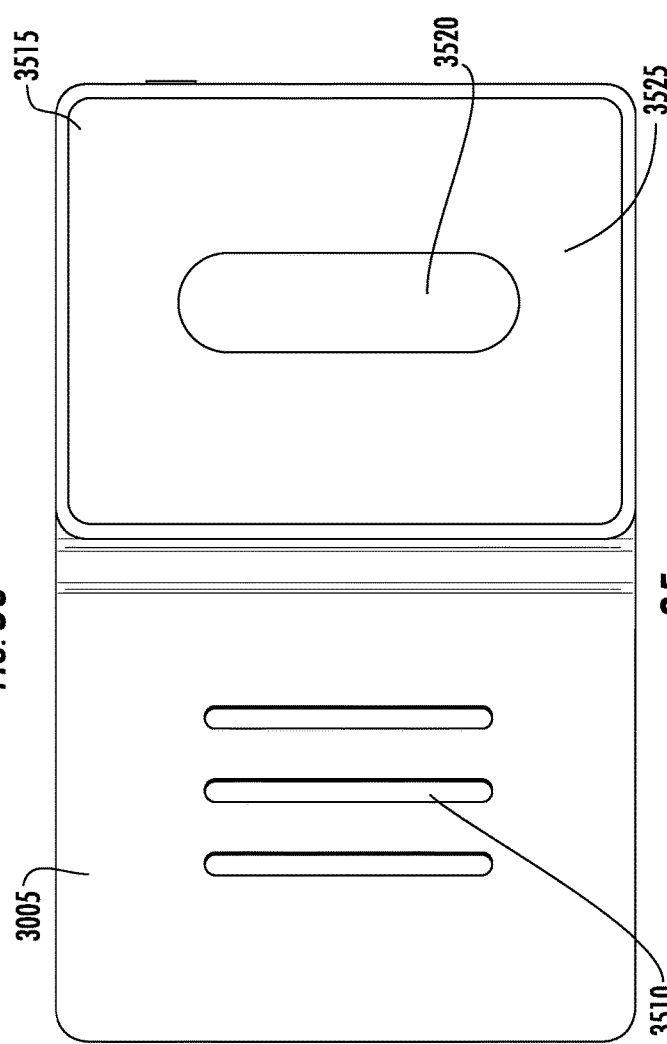
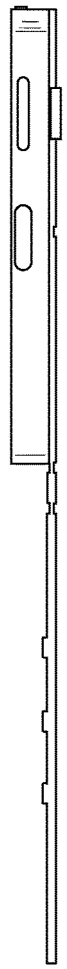
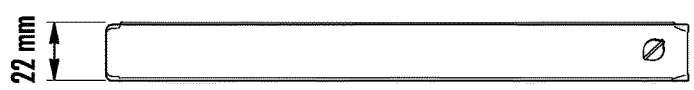

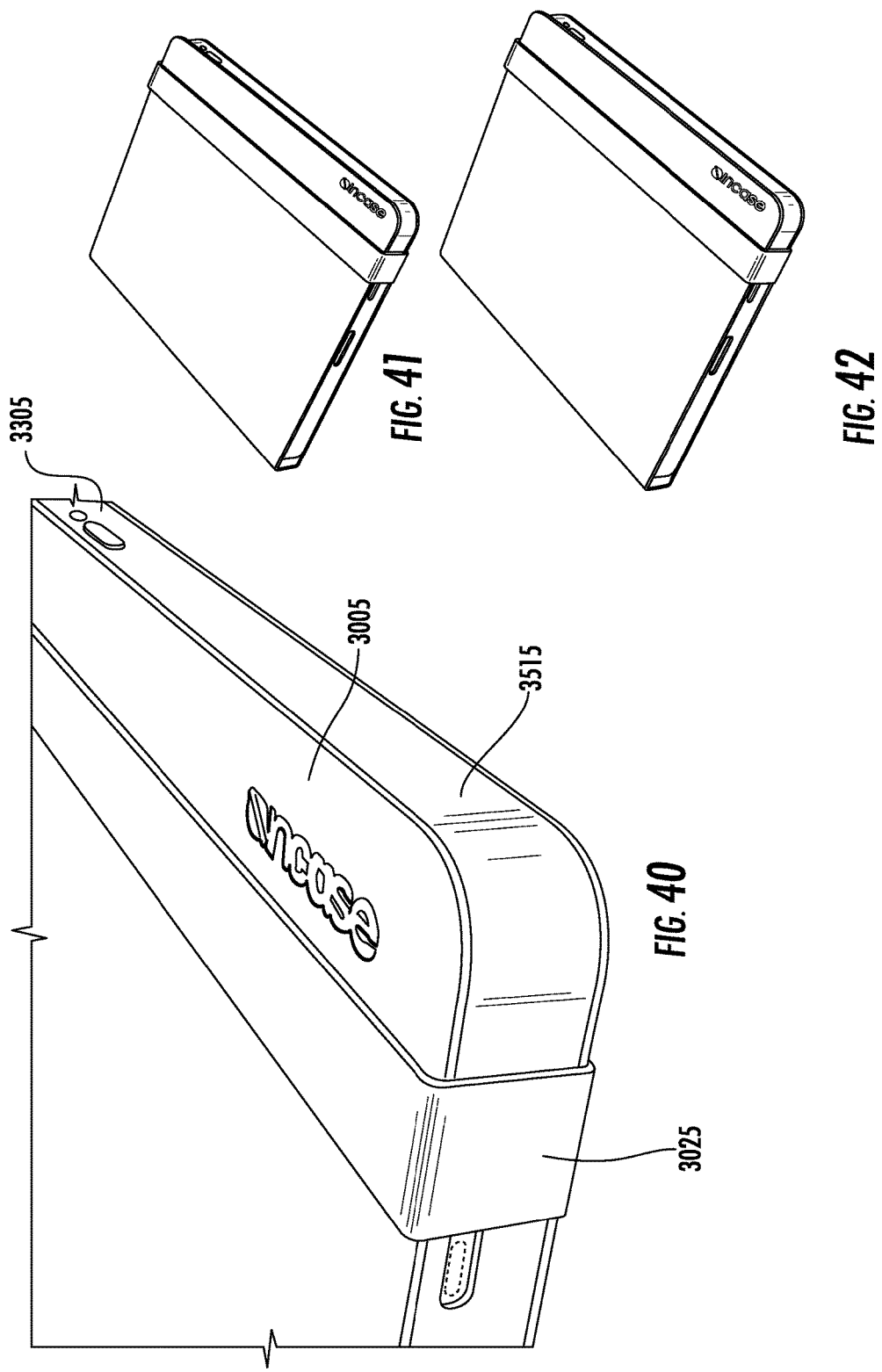

CASE FOR ELECTRONIC TABLET

CROSS-REFERENCE TO RELATED APPLICATIONS

This patent application is a continuation of U.S. patent application Ser. No. 14/532,994, filed Nov. 4, 2014, issued as U.S. Pat. No. 9,603,425 on Mar. 28, 2017, which is a divisional of U.S. patent application Ser. No. 13/682,627, filed Nov. 20, 2012, issued as U.S. Pat. No. 8,875,879 on Nov. 4, 2014, which is a continuation of U.S. patent application Ser. No. 13/069,207, filed Mar. 22, 2011, issued as U.S. Pat. No. 8,312,991 on Nov. 20, 2012, which is a continuation of U.S. patent application Ser. No. 12/892,736, filed Sep. 28, 2010, issued as U.S. Pat. No. 8,328,008 on Dec. 11, 2012, which claims the benefit of U.S. provisional applications 61/372,450, filed Aug. 10, 2010, and 61/382,472, filed Sep. 13, 2010. These applications are incorporated by reference along with all other references cited in this application.

BACKGROUND OF THE INVENTION

This invention relates to accessories for electronic devices and more specifically to cases for portable electronic devices and electronic tablets.

With each new generation, portable electronic devices provide greater functionality and have more capabilities. These portable electronic devices allow people to play and record music, send and receive e-mail, send text messages, browse Web pages, make phone calls, play and record video, take and view pictures, edit documents, and much more. These devices continue to revolutionize the way people interact, learn, connect with other people, conduct business, and find things. They help people manage their daily lives and can be a source of entertainment. These devices can be used to store valuable information including personal information (e.g., phone numbers, financial information, private photos or videos, and favorite music tracks).

Typically these devices are intended to be carried or moved about. As such, these devices are more vulnerable to damage as compared to nonportable devices. These devices are more likely to be accidentally dropped, hit, or scratched. Some types of damage may be cosmetic (e.g., scratch). However, other types of damage may ruin or limit the functionality of the device. Often these devices contain sensitive and fragile components (e.g., screen, camera lens, flash, processors, accelerometers, and sensors). Accidentally dropping the device could render various features unusable.

Protective cases are used to protect these devices from possible damage. It is desirable that these cases allow users to use the functionality of their devices, while devices remain in their cases. Cases can also be used to enhance the functionality and capabilities of the device.

Therefore, there is a need for cases for portable electronic devices that will protect the devices, while at the same time enhance the functionality and usability of the devices.

BRIEF SUMMARY OF THE INVENTION

A case incorporates a built-in stand for the device which the case houses. The built-in stand allows using the case as a stand without needing to carry a separate standalone stand device. By incorporating the stand as part of the case, the case has additional functionality and usability. Since the stand is built-in or integrated, the stand will be available wherever the case is and is harder to lose than having a separate stand.

In a specific implementation, a case for a portable electronic device includes a bezel defining a rectangular front opening through which a screen of the portable electronic device will be visible, a backing, opposite the rectangular front opening, including a first surface against which a back of the portable electronic device will be placed, and an outer cover. The outer cover includes first, second, third, and fourth cover edges, where the second and fourth cover edges are longer than the first and third cover edges, first, second, and third hinges, each hinge extending from the second cover edge to the fourth cover edge, and at least one edge stop on an inside surface of the outer cover. The at least one edge stop extends in a direction from the second cover edge to the fourth cover edge. A first portion of the inside surface of the outer cover from the third cover edge to the first hinge is connected to a second surface of the backing, opposite the first surface of the backing.

In one embodiment, the case includes a sleeve having the bezel and the backing. The sleeve includes first, second, third, and fourth sides. The first and third sides are longer than the second and fourth sides. The first side includes a side opening through which the portable electronic device can be inserted into the sleeve, and a latch to removably secure the portable electronic device in the sleeve.

In another embodiment, the case includes a frame having the bezel and the backing. The bezel includes an elastic material to permit the bezel to be peeled back thereby enlarging the front opening and permitting the electronic device to be inserted through the enlarged front opening.

The case may further include an elastic band, connected to the outer cover. The elastic band extends from the second cover edge to the fourth cover edge. The elastic band can be positioned to hold the outer cover against the front opening, thus preventing rotating of the first and second hinges.

The elastic band may be between the first hinge and the third cover edge. A width of a gap between the third cover edge and the elastic band may be at least a width of the elastic band.

In one embodiment, the at least one edge stop includes a groove extending from the second cover edge to the fourth cover edge. In another embodiment, the at least one edge stop includes a rail projecting above the inside surface of the outer cover.

In a specific implementation, when the case is folded into a stand a portion of the outer cover defines a base surface of the stand. A first portion of the base surface extends from the at least one edge stop to the first cover edge.

The second hinge may be between the first and third hinges, a length of the base surface may be from the first cover edge to at least the third hinge, and the length of the base surface may be greater than a length from the third hinge to the second hinge.

In a specific implementation, a case for a portable electronic device includes an enclosure or holder portion including first, second, third, fourth, front, and back sides. The first and third sides are longer than the second and fourth sides. The front side includes a bezel defining a rectangular front opening through which a screen of the portable electronic device will be visible. An outer cover portion includes first, second, third, and fourth cover edges, where the second and fourth cover edges are longer than the first and third cover edges. There are first and second hinges, each hinge extending from the second cover edge to the fourth cover edge. The outer cover portion is connected to the back side of the enclosure portion at the third edge, and the outer cover portion is not connected to the back side of the enclosure portion at the first and second hinges, allowing the outer cover portion to rotate at the first and second hinges. There is an elastic band, connected to the outer cover portion. The elastic band extends from the second cover edge to the fourth cover edge. The elastic band can be positioned to hold the outer cover portion against the front opening, thereby preventing rotating of the first and second hinges.

A gap between the third edge and the elastic band may be at least a width of the elastic band. A distance from any one of the first or second hinges to the elastic band may be greater than a distance from the elastic band to the third edge.

In a specific implementation, the first side of the enclosure portion includes a side opening through which the portable electronic device can be inserted into the enclosure. The enclosure portion may include a latch on the first side to removably secure the portable electronic device in the enclosure.

In another specific implementation, the bezel includes an elastic material to permit the bezel to be elastically deformed, thereby enlarging the rectangular front opening and permitting the portable electronic device to be inserted through the enlarged rectangular front opening.

In a specific implementation, a method includes forming an outer cover having first, second, third, and fourth cover edges, where the second and fourth cover edges are longer than the first and third cover edges. Creating first, second, and third hinges in the outer cover. Creating at least one edge stop on an inside surface of the outer cover. Forming an enclosure for a portable electronic device, the enclosure including a bezel defining a front opening through which a screen of the portable electronic device will be visible. Positioning the enclosure on the inside surface of the outer cover so that the first hinge is one of above or below the enclosure and the enclosure is between the second hinge and the third cover edge. Positioning an elastic band on the outer cover. And attaching the elastic band and a portion of the enclosure to the outer cover, where an attached portion of the enclosure is between the first hinge and the third cover edge.

In an implementation, positioning an elastic band includes positioning ends of the elastic band between the enclosure and the outer cover. In another implementation, positioning an elastic band includes positioning ends of the elastic band on an outside surface of the outer cover. An unattached portion of the enclosure may be between the first hinge and the second hinge.

In a specific implementation, a case for a portable electronic device includes a rectangularly shaped cover including first, second, third, and fourth cover edges. The first and third cover edges extend in a first direction and are parallel to each other. The second and fourth cover edges extend in a second direction and are parallel to each other. The second direction is transverse to the first direction, and the second cover edge is longer than the first cover edge. There is a first hinge, formed in the cover, between the first and third cover edges, extending in the first direction. The cover from the first cover edge to the first hinge is a front flap, and the front flap has a first length from the first hinge to the first cover edge that is sufficiently long to cover a front screen of the portable electronic device.

There is a second hinge, formed in the cover, between the third cover edge and the first hinge, extending in the first direction, parallel to the first hinge. There is a set of grooves formed between the first cover edge and the first hinge on an inside of the cover.

There is a holder, connected to the rectangularly shaped cover, that removably connects the portable electronic device to the case. The portable electronic device is inserted into the holder in a direction from the second hinge to the third cover edge, and when inserted into the holder, the second hinge will positioned behind a back of the portable electronic device.

In a specific implementation, a case for a portable electronic device includes a rectangularly shaped cover including first, second, third, and fourth cover edges. The first and third cover edges extend in a first direction and are parallel to each other, the second and fourth cover edges extend in a second direction and are parallel to each other, the second direction is transverse to the first direction, and the second cover edge is longer than the first cover edge.

There is a first hinge, formed in the cover between the first and third cover edges and extending in the first direction. The cover from the first cover edge to the first hinge is a front flap. The front flap has a first length from the first cover edge to the first hinge that is sufficiently long to cover a front screen of the portable electronic device when the front flap is folded via the first hinge to close the case.

There is a second hinge, formed in the cover, between the third cover edge and the first hinge, extending in the first direction, and parallel to the first hinge. There are a set of grooves formed between the first cover edge and the first hinge on an inside of the front flap.

There is a holder, attached to the rectangularly shaped cover, that removably attaches the portable electronic device to the case between the second hinge and the third cover edge. The portable electronic device is to be inserted into the holder in a direction from the first hinge to the third cover edge, and when the portable electronic device is inserted into the holder, the second hinge will be positioned behind a back of the portable electronic device. The rectangularly shaped cover may include rounded corners.

In a specific implementation, the cover from the third edge to the second hinge has a second length, and the cover from the second hinge to the first hinge includes a third length, and the third length is greater than the second length. In a specific implementation, the cover from the third edge to the second hinge has a second length, and the cover from the second hinge to the first hinge includes a third length, and a sum of the first, second, and third lengths is at least about 407 millimeters. A fourth length of the first hinge may be at least about 245 millimeters.

In a specific implementation, the holder includes a bezel forming a front opening of the holder through which a screen will be visible. The holder may include a backing material including a textured surface.

The cover may include a polycarbonate material. The cover may include a composite including polyurethane and polycarbonate.

In a specific implementation, the inside of the front cover has three grooves. When the portable electronic device is positioned in a first of the grooves, a built-in stand of the case has an angle of about 45 degrees. When the portable electronic device is positioned in a first of the grooves, a built-in stand of the case has an angle of about 60 degrees. When the portable electronic device is positioned in a first of the grooves, a built-in stand of the case has an angle of about 75 degrees. When portions of the cover on either side of the second hinge are folded against each other, a built-in stand of the case has an angle of about 8 degrees.

In a specific implementation, when utilizing a first of the grooves, a built-in stand of the case has an angle of about 45 degrees. When utilizing a second of the grooves, the built-in stand of the case has an angle of about 60 degrees. When utilizing a third of the grooves, the built-in stand of the case has an angle of about 75 degrees. When portions of the cover on either side of the second hinge are folded against each other, the built-in stand of the case has an angle of about 8 degrees.

The case may further include an elastic band, attached to the cover between the second hinge and the third cover edge, where the elastic band extends in the first direction.

In a specific implementation, a case for a portable electronic device includes a rectangularly shaped cover including first, second, third, and fourth cover edges. The first and third cover edges extend in a first direction and are parallel to each other, the second and fourth cover edges extend in a second direction and are parallel to each other, the second direction is transverse to the first direction, and the second cover edge is longer than the first cover edge.

There is a first hinge, formed in the cover, between the first and third cover edges, extending in the first direction, and the cover from the first cover edge to the first hinge is a front flap, and the front flap has a first length from the first cover edge to the first hinge to the first cover edge that is sufficiently long to cover a front screen of the portable electronic device when the front flap is folded via the first hinge to close the case.

There is a second hinge, formed in the cover, between the third cover edge and the first hinge, extending in the first direction, and parallel to the first hinge.

There are a plurality of rails, extending in the first direction, formed between the first cover edge and the first hinge on an inside of the front flap.

There is a holder, attached to the rectangularly shaped cover, that removably attaches the portable electronic device to the case between the second hinge and the third cover edge. The portable electronic device is to be inserted into the holder in a direction from the first to second hinge to the third cover edge, and when the portable electronic device is inserted into the holder, the second hinge will be positioned behind a back of the portable electronic device.

In an implementation, when utilizing a first of the rails, a built-in stand of the case has an first tilt angle. When utilizing a second of the grooves, the built-in stand of the case has a second tilt angle. When utilizing a third of the grooves, the built-in stand of the case has a third tilt angle, the first, second, and third tilt angles being different from each other.

In a specific implementation, when portions of the cover on either side of the second hinge are folded against each other, the built-in stand of the case has a fourth tilt angle, less than the first, second, and third tilt angles.

In a further implementation, there is an elastic band, attached to the cover between the second hinge and the third cover edge, where the elastic band extends in the first direction.

A first embodiment of the case may be referred to as a Convertible Book Jacket™ or CBJ™ case. A second embodiment the case may be referred to as a Convertible Maki Jacket™ or CMJ™ case. The CBJ and CMJ cases can be folded into a stand for the electronic device. In a specific implementation, stand viewing angles include about 45, 60, and 75 degrees for the CMJ and CBJ cases. Each case can also be folded into a working angle. In a specific implementation, the working angle on the CBJ case is about 8 degrees and the working angle on the CMJ case is about 6 degrees. In a specific implementation, the CMJ case is a polyurethane (PU) laminate with a polycarbonate (PC) reinforcement structure. The case hinges in the thin areas where the laminate is not reinforced with polycarbonate.

In a specific implementation, a method of making a case for an electronic tablet includes: providing a front cover portion having interior and exterior sides, and a first edge, second edge, and third edge; forming a plurality of grooves on the interior side of the front cover, where the grooves extend in a first direction parallel to the first edge of the front cover; providing a back cover portion having a fourth edge extending in the first direction; providing an inside holder portion, where the inside holder portion is adapted to retain the electronic tablet in the case while a screen of the electronic tablet device remains visible; providing a spine edge portion that joins the front and back cover portions; coupling a first folding hinge, extending in the first direction, between the back cover portion and the inside holder portion; coupling a second folding hinge, extending in the first direction, between the front cover and spine edge portions; coupling a third folding hinge, extending in the first direction, between the back cover and spine edge portions, where a first length of the first edge is longer than a second length of the second edge from the first edge to the second folding hinge and is longer than a third length of the third edge from the first edge to the second folding hinge, and the second and third lengths extend in a second direction, perpendicular to the first direction; allowing folding of the case into a first stand position by rotating the first folding hinge in a first rotation direction so a bottom of the inside holder portion can be inserted into a first groove of the plurality of grooves; and allowing folding of the case into a second stand position by rotating the first folding hinge in the first rotation direction, further than for the first stand position, so the bottom of the inside holder portion can be inserted into a second groove of the plurality of grooves, where the second groove is positioned on the interior side of the front cover closer to the first edge than the first groove.

In a specific implementation, a case for an electronic tablet device includes: a front cover portion, including interior and exterior sides, where the front cover portion is rectangularly shaped, planar, and defined by a first edge, second edge, and third edge, the first edge extending in a first direction and being longer than the second and third edges, and the interior side of the front cover includes a plurality of grooves, and the grooves extend in the first direction; a back cover portion, including interior and exterior sides, where the back cover portion is rectangularly shaped, planar, and defined by a fourth edge, fifth edge, and sixth edge, the fourth edge extending in the first direction and being longer than the fifth and sixth edges, and the back cover portion includes a first folding hinge extending in the first direction; a spine edge portion, coupling the front and back cover portions together, where a second folding hinge separates the front cover and spine portions, a third folding hinge separates the back cover and spine edge portions, the second and third folding hinges extend in the first direction, and the second edge extends from the first edge to the second folding hinge, the third edge extends from the first edge to the second folding hinge, the fifth edge extends from the fourth edge to the third folding hinge, and the sixth edge extends from the fourth edge to the third folding hinge; an inside holder portion, connected to the first folding hinge, where the inside holder portion will retain the electronic tablet device in the case, and the case can be folded into a two or more of stand positions including: a first stand position when the first folding hinge is rotated in a first rotation direction so a bottom of the inside holder portion is inserted into a first groove of the grooves, and a second stand position when the second folding hinge is rotated in the first rotation direction so the bottom of the inside holder portion is inserted into a second groove of the grooves, where the second groove is positioned further from the second hinge than the first groove.

In a specific implementation, a method of making a case for an electronic tablet includes: providing a front cover portion having interior and exterior sides, and a first edge, second edge, and third edge; forming a plurality of bumps on the interior side of the front cover, where the bumps extend in a first direction parallel to the first edge of the front cover; providing a back cover portion having a fourth edge extending in the first direction; providing an inside holder portion, where the inside holder portion is adapted to retain the electronic tablet in the case while a screen of the electronic tablet device remains visible; providing a spine edge portion that joins the front and back cover portions; coupling a first folding hinge, extending in the first direction, between the back cover portion and the inside holder portion; coupling a second folding hinge, extending in the first direction, between the front cover and spine edge portions; coupling a third folding hinge, extending in the first direction, between the back cover and spine edge portions, where a first length of the first edge is longer than a second length of the second edge from the first edge to the second folding hinge and is longer than a third length of the third edge from the first edge to the second folding hinge, and the second and third lengths extend in a second direction, perpendicular to the first direction; allowing folding of the case into a first stand position by rotating the first folding hinge in a first rotation direction so a bottom of the inside holder portion can be inserted between a first and second bump of the plurality of bumps; and allowing folding of the case into a second stand position by rotating the first folding hinge in the first rotation direction, further than for the first stand position, so the bottom of the inside holder portion can be inserted between the second bump and a third bump of the plurality of bumps, where the third bump is positioned on the interior side of the front cover closer to the first edge than the second bump.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 1A-1H show various views of a first embodiment of a case for a portable electronic device.

FIG. 2B shows a back perspective view after the case is folded into a stand.

FIG. 2I shows a side view of the stand in a viewing angle.

FIG. 3C shows a top view of the stand in the portrait orientation.

FIG. 4 shows an inside view of the case.

FIG. 8 shows a top view the assembled case pieces.

FIG. 9 shows a cross section of the assembled case pieces.

FIGS. 10-29 show various views of a second embodiment of a case for a portable electronic device.

FIGS. 30-42 show various views of a third embodiment of a case for a portable electronic device.

DETAILED DESCRIPTION OF THE INVENTION

Figure 1H:

FIGS. 1A-1H show various views of an embodiment of a case for a tablet computer. This embodiment of a case may be referred to as a Convertible Book Jacket™ or CBJ™ case. Convertible Book Jacket and CBJ are trademarks of Incase Designs Corp.

FIGS. 1A-1E show top, side, and bottom views of the case. In an implementation, the case is for a tablet computer, tablet PC, or other tablet-type electronic device. Some examples of electronic tablets include Apple iPad, Dell Streak, HP TouchSmart, Toshiba Portege, Fujitsu Lifebook, Lenovo IdeaPad, Toshiba Libretto, Amazon Kindle, Sony Reader, Barnes & Noble Nook, Microsoft Courier, and others. Aspects of the invention are also applicable to other types of devices including smartphones (such as the Apple iPhone and Google Android phones), personal digital assistants (PDAs), handheld computers, and notebook computers. Any trademarks listed in this patent application are the property of their respective owners Portable electronic device are valuable because their functionality, the information they contain, and time and expense to replace. A case is typically much easier and less expensive to replace than the device which it houses and protects.

A case protects the portable electronic device from scratches, dings, dents, and other damage. The case also provides shock absorption. The case will absorb impacts, preventing shock to the components of the device which are often delicate. The case can also improve the grip to the device and case combination. The case may include a texture pattern, be made from a tacky material, or have a tacky coating, or include a wrist or neck strap. The case may also be waterproof or water resistant to protect the device from rain, snow, and surf.

A case may include a battery to lengthen a battery life of the device. A battery case is described in U.S. Pat. No. 7,612,997, issued Nov. 3, 2009, which is incorporated by reference. A case may include a stand (e.g., built-in stand). With such a stand, a user can stand the device on a table and watch the screen hands-free. Some examples of some case designs are in U.S. patent application 61/365,302, which is incorporated by reference along with all other references cited in this application.

This patent application incorporates by reference U.S. Pat. No. 7,612,997, issued Nov. 3, 2009; D587,896, issued Mar. 10, 2009; D582,149, issued Dec. 9, 2008; D581,151; D579,213, issued Oct. 28, 2008; and D575,056, issued Aug. 19, 2008. These patent applications are incorporated by reference.

A case is typically an important accessory for the device that it protects. For, a person might accidentally drop a portable electronic device in the case on the floor when running to catch a flight for a business trip at the airport. The case may cushion the drop, thus preventing major damage to the portable electronic device. The portable electronic device will remain intact and unbroken, saved by the case. The person can pick up the portable electronic device, continue on the flight, and use the portable electronic device on the business trip.

If the portable electronic device had not been protected by a case, the portable electronic device might have become broken. The screen may become cracked or there might have been other damage rendering the device inoperable. The person typically would not have been able to replace the portable electronic device soon enough, especially if there was important information saved on the portable electronic device (e.g., sales presentation slides) that are needed for the business trip.

FIGS. 1A-1E show different views of a case for an electronic tablet device. As discussed above, this case may also be used for other types of electronic devices including, for example, electronic book readers, electronic books, personal digital assistants (PDAs), and smartphones.

FIG. 1A shows a front view of the case. The case has an elastic band closure 103. When the case is in a closed position (as shown in FIGS. 1A-1E), the elastic band secures a front flap 106 of the case against the screen of the electronic device; this protects the screen from damage.

FIG. 1B shows a side 109 view of the case, showing a spine panel 110 of the case. FIG. 1C shows a side 112 view of the case. FIG. 1D shows a side 115 view of the case. FIGS. 1C and 1D show a sleeve 117 which holds the electronic device. Sides 112 and 115 of the sleeve have openings that allow access to ports and like features of the electronic device.

FIG. 1E shows a back view of the case. The case has a back flap 119. Elastic band 103 is attached to the back flap at locations 127 and 125 of the back flap. So, the elastic back is stretched to hold the front flap to the back flap with tension, thus securing the electronic device (in the sleeve) between the flaps.

The case can be folded to act as a stand for the electronic device. To facilitate the case being folded or converted into a stand, the back flap of the case has a crease hinge 129. Further details follow below. The front flap does not have a hinge, crease or otherwise, running through it.

In a specific implementation, the flaps of the case have rounded corners 131, 133, 135, and 137. Rounded corners provide a smoother edging without hard angles, which makes sliding into a bag easier and less likely to catch. Rounding also helps prevent bending or dog-earing of the corners.

In a specific implementation, a length of the case is about 250 millimeters (about 9.8 inches), and a width of the case is about 200 millimeters (about 7.9 inches). The case (or spine) is about 30 millimeters (about 1.2 inches) thick. These dimensions of the case can vary to accommodate the electronic device being housed. There are openings in sides of the case that allow access to ports and buttons of the electronic tablet without needing to remove the electronic tablet from the case. The case has a back surface with a groove, break, or crease that allows bending of this back surface to make a stand for the electronic tablet.

Figure 1G:
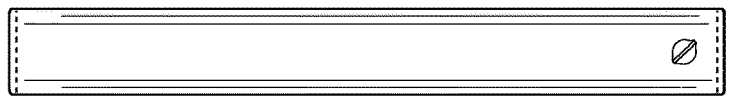
Figure 1F:
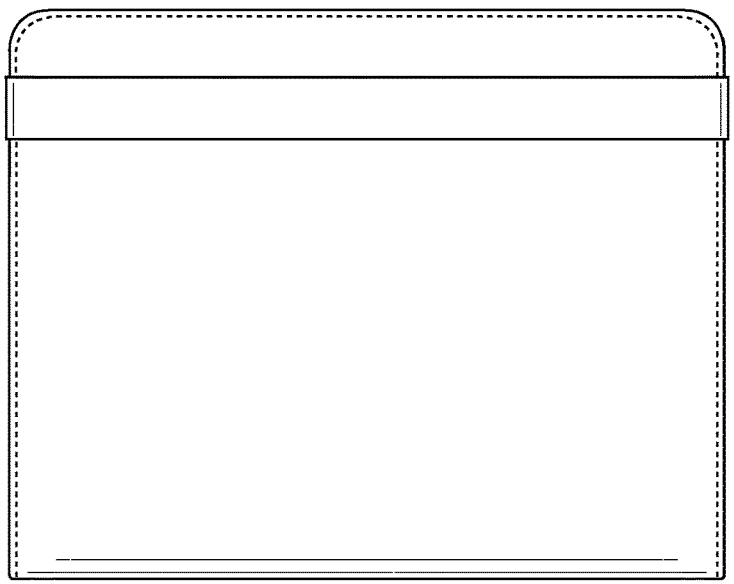

FIGS. 1F-1H shows front, side, and back views of a specific implementation of a case.

Figure 2A:
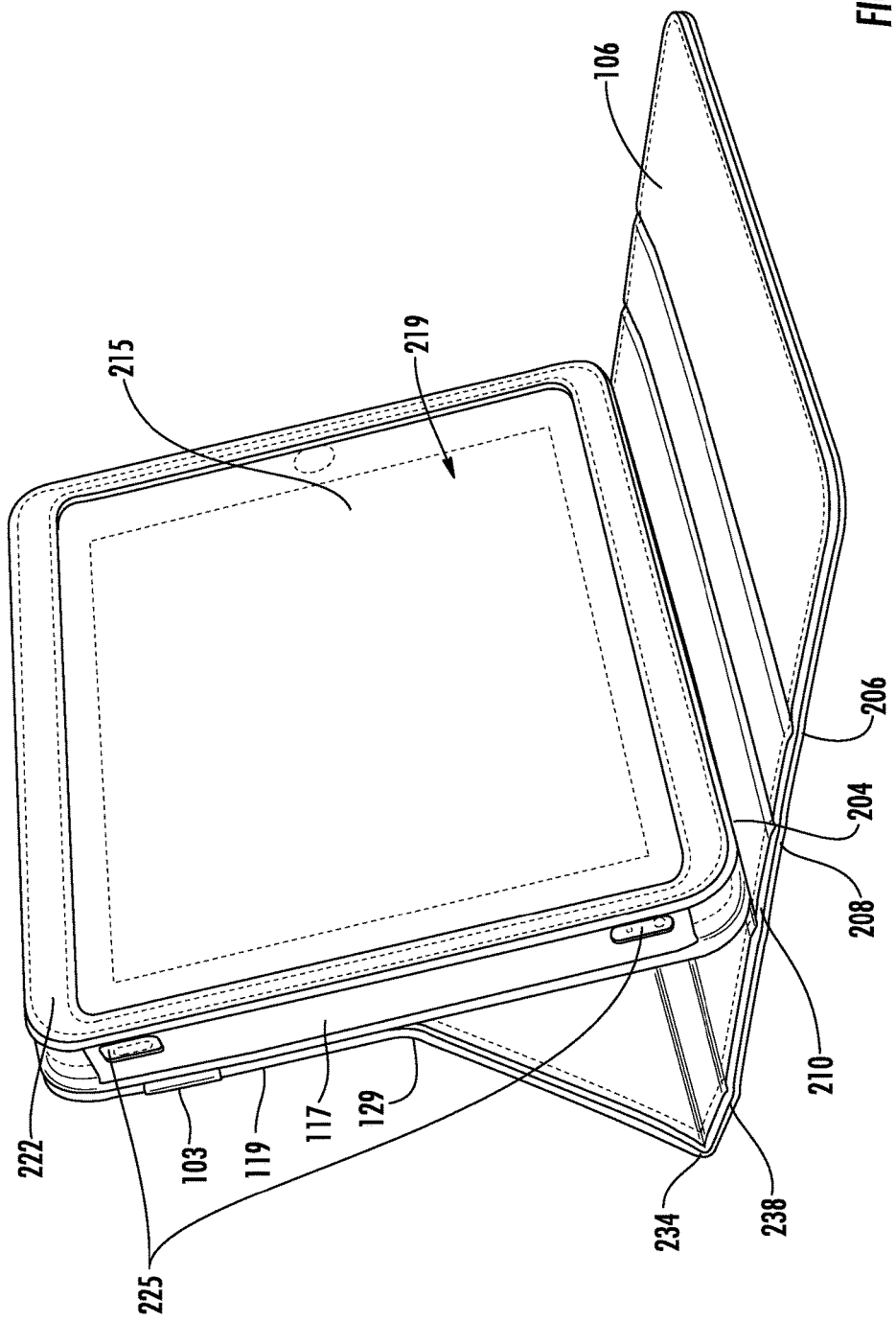
FIG. 2A shows a front perspective view of the open case after the case is folded into a stand.
Figure 2C:
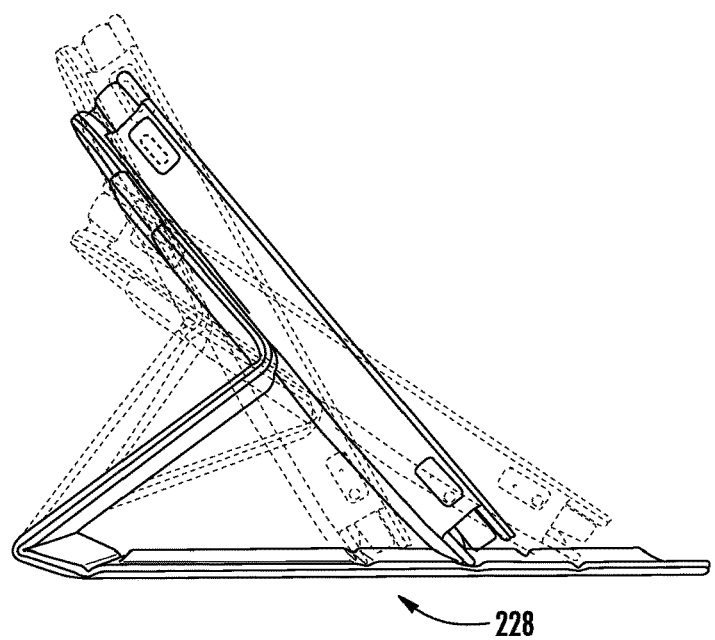
FIG. 2C shows how the stand can be adjusted into various viewing angles.
Figure 2D:
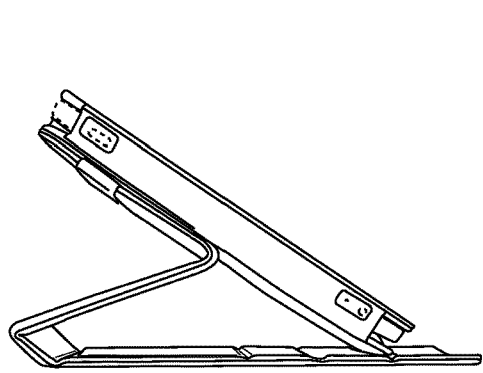
FIG. 2D shows a first viewing angle of the stand in a landscape orientation.
Figure 2E:
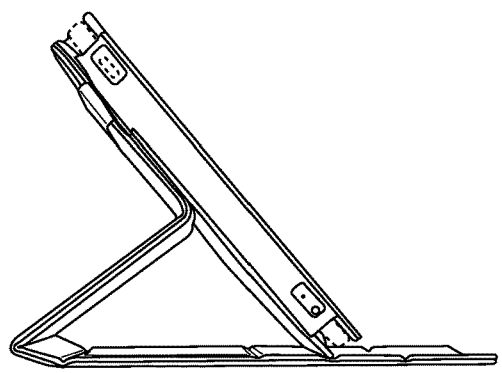
FIG. 2E shows a second viewing angle of the stand.
Figure 2F:
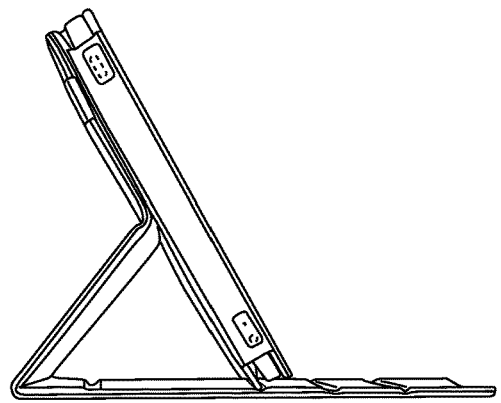
FIG. 2F shows a third viewing angle of the stand.
Figure 2G:
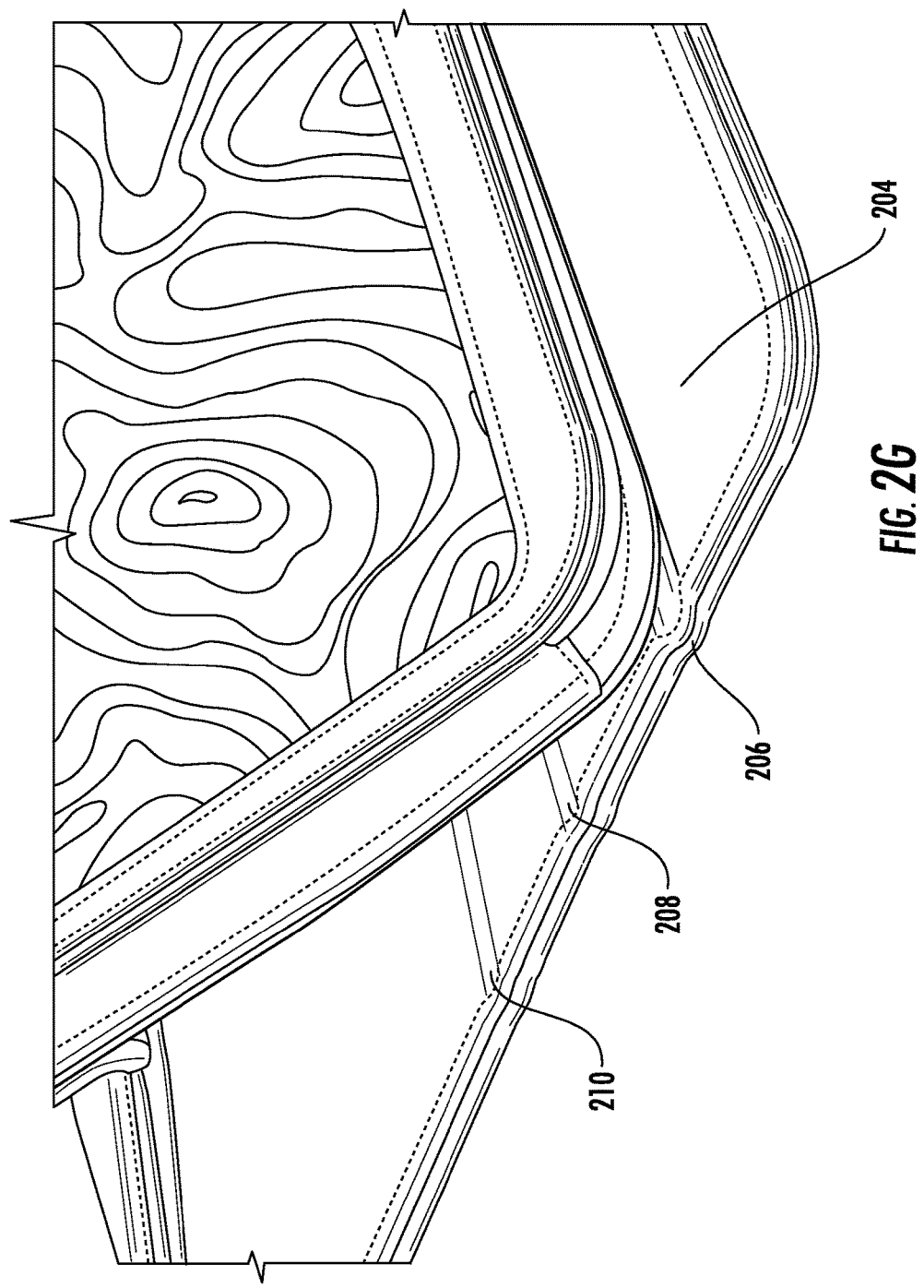
FIG. 2G shows a close-up view of the stand.
Figure 2H:
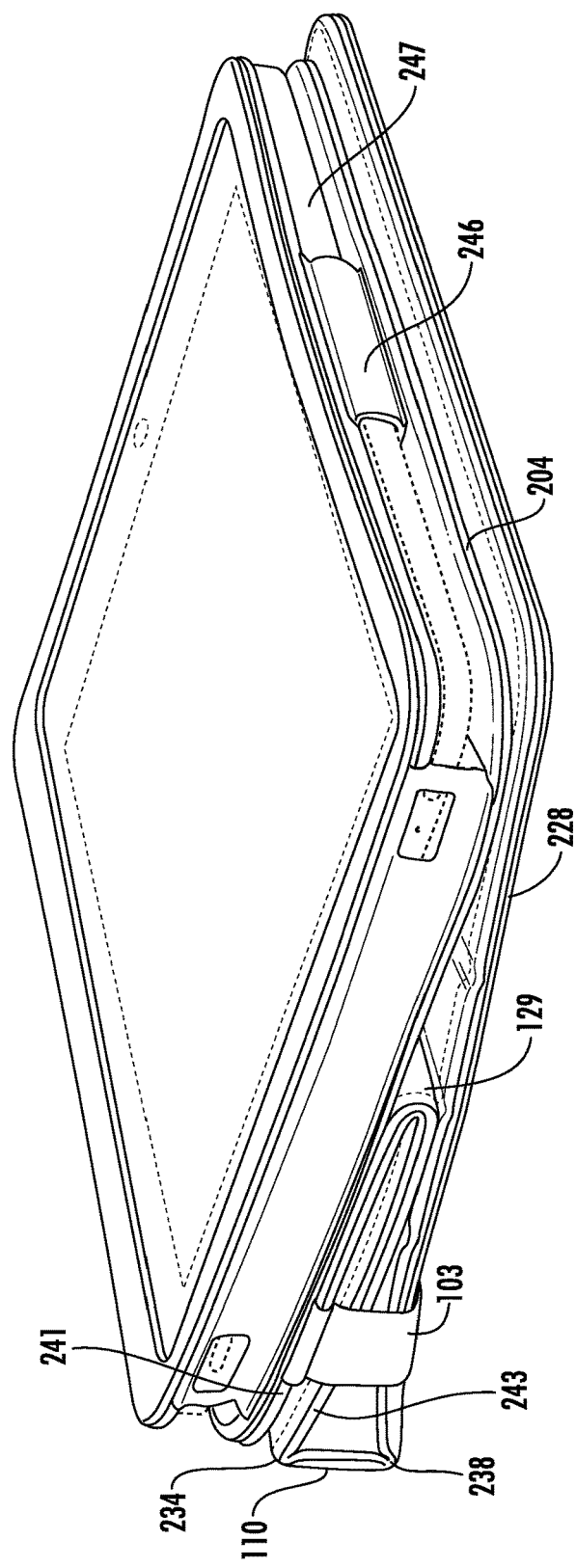
FIG. 2H shows a working angle of the stand.

The case has a built-in stand feature that allows for multiple viewing angles. FIGS. 2A-2H show the case being used as a stand for the electronic device, where the stand is in a landscape orientation. FIG. 2A shows a front perspective view the open case after the case has been converted, by folding, into a stand. FIG. 2B shows a back perspective view. FIG. 2C shows how the sleeve and front flap of the case can be adjusted to be placed into one of three viewing angles. FIG. 2D shows a first viewing angle, FIG. 2E shows a second viewing angle, and FIG. 2F shows a third viewing angle. FIG. 2G shows a close-up view of an edge 204 of the front flap placed into a groove 206 that holds the case at the first viewing angle. FIG. 2H shows the case folded in a working angle view position.

As shown in FIGS. 2A-2G, in a specific implementation, there are three grooves 206, 208, and 210 in a back (or inside surface) of the front panel 106. These grooves are used to form a built-in stand for the device. There are multiple grooves (such as three) to permit multiple different viewing angles. Three grooves allow for positioning the display of the electronic device into three viewing angles, viewing angle 1 (FIG. 2D), viewing angle 2 (FIG. 2E), and viewing angle 3 (FIG. 2F). These viewing angles are different from each other. There is no need to flip or turn the case upside down to access any of the different viewing angles. The viewing angle may be adjusted by sliding edge 204 of the sleeve forward or back along the back of the front panel until it fits into one of the grooves. The electronic device need not be removed from the case to use the stand feature of the case.

In other implementations, there may be fewer grooves, such as one or two, which would allow for fewer than three viewing angles. For example, two grooves allow for two viewing angles, and one groove allows for one viewing angle. There may be more than three grooves (e.g., four, five, six, or seven) to allow for more than three viewing angles. For example, four grooves allow for four viewing angles, and five groves allow for five viewing angles. Additionally, the case can allow for a viewing angle when not using any of the grooves. For example, the case has a working angle view (FIG. 2H) which is discussed below.

In an implementation, the case is made from a neoprene material. Neoprene provides cushioning and shock absorption for the device which the case protects. However, in other implementations, other materials can be used including silicone, rubber, fabric, and many others. Other examples of case material include vinyl, polyvinyl chloride (PVC), plastic, thermoplastic, cloth, leather, artificial leather, synthetic leather, synthetic leather made of plastic (sometimes referred to as pleather), poromeric imitation leather, koskin, leatherette, metal (e.g., stainless steel, aluminum, or titanium), and carbon fiber.

In FIG. 2A, a representative electronic tablet device 215 is shown in sleeve 117 of the case. The screen of this electronic tablet is viewable through a front opening 219 formed in a bezel 222 of the sleeve. The bezel surrounds the front opening on four sides, holding the electronic tablet in the sleeve so that the electronic tablet can not easily come loose or detached from the case.

Through the front opening, a user can view the entire screen. In an implementation, the front opening has about a 4:3 aspect ratio. For 246-millimeter (9.7-inch) diagonal screen size, the front opening has a length of at least about 198 millimeters (7.8 inches) and a width of at least about 147 millimeters (5.8 inches). In other implementations, the aspect ratio may vary slightly or be different, such as 16:9 or 16:10.

Typically, the size of the front opening is larger than the screen size of the electronic device to allow the user access to any buttons, controls, or ports in the front of the device. Also by making the front opening larger than the screen, if the electronic tablet were to shift in position in the sleeve slightly, the entire screen would remain visible and not be partially blocked by the bezel. The sides of the sleeve can have die cut openings or holes 225 positioned to allow access to controls and ports of the electronic tablet. The tablet device does not need to be removed from the case to view the screen or access the device's controls or ports.

Referring to FIGS. 2D-2F, the front flat of the case is rigid and forms a flat base surface 228 of the stand. This relatively large flat base surface gives stability when the case is used as a stand. A length of the flat base surface is at least about 200 millimeters (width of the case), while a width is about 250 millimeters (length of the case). Regardless of which viewing angle is being used (FIG. 2D or 2E or 2F), the flat base surface of the stand will be at least a footprint size of the front flap.

The flat base surface feature of the case makes the stand unlikely to rock or tip over when it is used. For a tablet stand without a relatively large flat base surface, it is easier for someone to accidentally knock the tablet and have it flip over and drop off, for example, a table onto a hard floor. By contrast, when the case in FIG. 2A is accidentally knocked, the tablet would fall back and fall onto the front flap, but the relatively large flat base surface would prevent the tablet from dropping on the floor. With the case of the invention, damage to the tablet is avoided.

In an implementation, the spine has a length of about 30 millimeters and the flat base surface a length of about 200 millimeters. A length of the flat base surface (in a direction perpendicular to the bottom edge of the sleeve) is at least 2 times greater than the spine length. This will provide greater stability for the stand than having a footprint length of only the spine. In various implementations, the length of the flat base surface is at least 3 times greater than the spine, at least 4 times greater than the spine, at least 5 times greater than the spine, or at least 6 times greater than the spine length. Further, for stability, wherever the sleeve is placed on the flat base surface to make a stand, a portion of the flat base surface will be behind the sleeve and a portion will be in front of the sleeve.

In operation, a case in the closed position, such as shown in FIGS. 1A-1E, is opened and unfolded into the stand position shown in FIGS. 2A-2G. Elastic band 103 is stretched and flipped from the front flap to the back flap as shown in FIG. 2B. Referring to FIGS. 2A and 2B, the stand has three hinges that facilitate folding the case into a stand. Hinge 129 is on the back flap, while hinges 238 and 234 are positioned on either side of spine 110.

FIG. 2H shows the case in a working angle position. The working angle is less sloped than the other three viewing angles described in FIGS. 2D-2F. The working angle is more ergonomic for when the user wants to type on an on-screen keyboard, such when a student takes notes in a classroom. For the working angle, the edge of the back of the case is not placed in any of the viewing angle grooves. The back of the case is folded to provide the working angle slope, and the elastic band is used to hold the case in the working angle position.

For the working angle position, edge 204 of the sleeve is not placed into any of the grooves. Rather, hinge 129 is folded until sides 241 and 243 of the back flap 119 (on either side of hinge 129) come into contact with each other. Spine 110 is rotated (via hinges 238 and 234) into position to lift and tilt the sleeve and electronic tablet into the working angle. The working angle can vary depending on the rotation of the hinges 238 and 234.

In a specific implementation, hinges 238 and 234 are rotated so that the spine is approximately perpendicular with respect to flat base surface 228. However, the spine can be rotated so that it is in an angle (e.g., 30, 45, 60, or 0 to 90 degrees) with respect to the flat base surface to give the desired working angle tilt. As shown in FIG. 2H, elastic band 103 can be stretched over the folded sides 241 and 243 and flat base surface 228 to hold the stand in the working angle position using tension.

FIG. 2H also shows a latch 246. The latch spans across a slot 247 of the sleeve and holds the electronic device in the sleeve. The latch can be removably secured using hook-and-loop fastener (e.g., Velcro) with an attachment point on an underside of the bezel. Other types of fasteners may be used. With the latch detached, the electronic device can be inserted into or removed through the slot of the sleeve. Thus, the latch keeps the electronic device removably secured within the sleeve.

FIG. 2I shows another side view the case being used as a stand for the electronic device. As discussed above, the case has crease hinge 129 to facilitate folding the case into a stand. Crease hinge 129 on the back flap is at a position below the top edge of the back of the sleeve rather than at the top edge of the sleeve. This positioning allows the back flap to be folded into the working angle shown in FIG. 2H.

At the option of the user, the contents of screen of the electronic device may viewed in the landscape orientation (e.g. for a movie) or portrait orientation (e.g., for a Web page). The orientation may be changed by simply flipping the screen ninety degrees (which is sensed by an internal accelerometer of the electronic device). The case of the invention supports this feature of the electronic device.

Figure 3B:
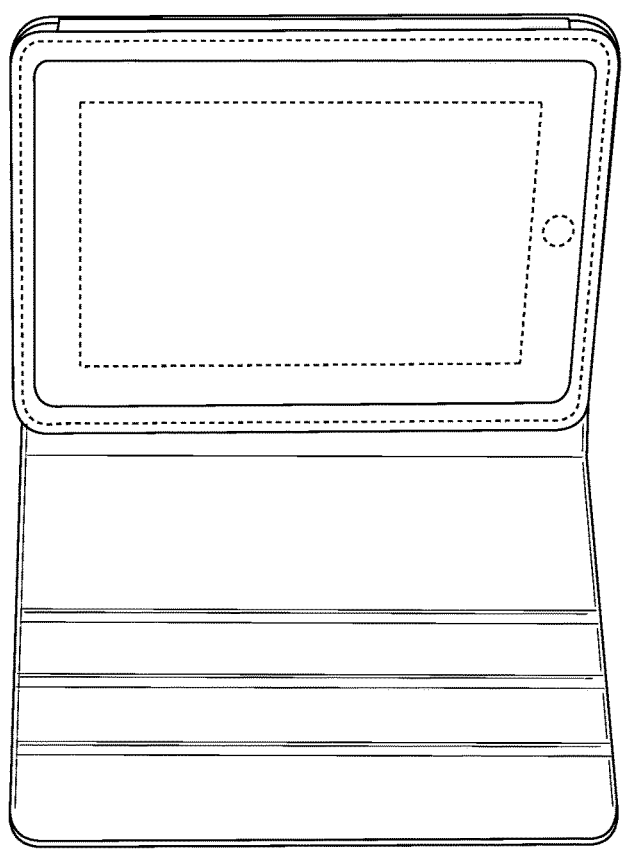
FIGS. 3A-3B show the stand folded in a portrait orientation.
Figure 3A:
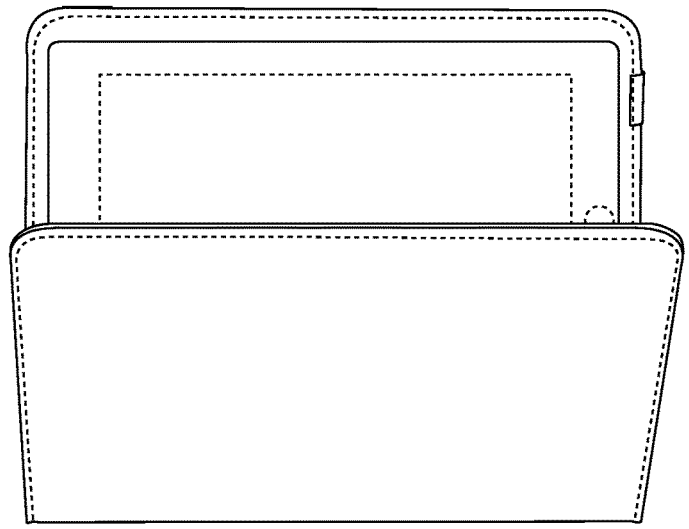

FIGS. 3A-3C show the case being used as a stand in the portrait orientation. FIG. 3A shows a front perspective view of the case partially opened in the portrait orientation. FIG. 3B shows a front perspective view of the case in the portrait orientation where the front flap has been flipped open to expose the screen of the electronic device. FIG. 3C shows a top view of the case in the portrait orientation.

FIG. 3B shows the grooves on an inside surface of the front flap for multiple viewing angles when the case is in the landscape orientation. In the portrait orientation, the grooves may not be used. Rather, when the case is folded into a stand having the portrait orientation, the edges of the case provide the stability for the stand.

Referring to FIG. 3C, hinges 129, 234, and 238 allow the front and back flaps, spine panel, and sleeve edges to be independently positioned so that there is sufficient stability to hold the electronic device in the portrait position. When the touch screen display of the device is used, this stand is unlikely to tip over because the stand can resist the touch forces being applied to the touch screen.

Also, the placement of hinge 129 allows turning the screen to allow a greater unblocked viewing angle. More people can view the screen at the same time. The screen will not be blocked or partially blocked by the front flap, which may prevent a person viewing from the left of the screen (when the flap is on the left-hand side as in FIGS. 3A-3C). The outline of the stand in FIG. 3C is an open polygon. However, by adjusting the pivoting of the hinges, an edge of the sleeve can touch the front flap to form a closed polygon.

FIG. 4 shows an inside of the case. There is a bezel to hold the electronic tablet. An interior surface inside the case, against which a back of the electronic tablet is placed, is suede backed with a debossed print pattern. In an implementation, the pattern is a topographic pattern. Some examples of topographic patterns are in U.S. Pat. D579,213, issued Oct. 28, 2008; D581,151, issued Nov. 25, 2008; and D587,896, issued Mar. 10, 2009. Various materials can be used for the interior surface including microfiber, velvet, silicone, rubber, fabric, and carbon fiber. The material may be tacky to grip the back of the electronic tablet, and also provide cushioning to protect the electronic tablet. The backing can grip the back of the electronic tablet without scratching or otherwise damaging the back of the electronic tablet.

In FIG. 4, a debossed textured pattern is formed by printing onto the suede material. The pattern forms grooves, indentations, or recesses into the suede material. Other textured patterns may be used such as an embossed pattern having raised features, rising from or on the surface of the material. Some processes to form the texture pattern may include etching, silk-screening, stamps, dies, rollers, thermal printing, deposition, coating, and many others. The pattern may include topographic lines as shown in FIG. 4A, vertical lines, horizontal lines, diagonal lines, dots, shapes (e.g., circles, rectangles, boxes), or combinations of these.

The pattern can help to removably grip the back of the electronic device and prevent the electronic device from sliding or shifting within the sleeve. The pattern can increase the friction between the back of the electronic device and the sleeve. With the bezel, textured backing, and latch, the case will hold electronic device securely. There will not be a need to apply an adhesive, adhesive strip, double-side tape, or the like to the back of the electronic device, which may damage or mar the back of the device.

Instead of printing pattern to provide texture in the sleeve, tacky or texture materials may be formed, molded, or attached on the sleeve backing. For example, a protective spine (see below) or slider rails may be positioned in the sleeve backing. The protective spine or slider rails may be made from a material such as silicone, rubber, thermoplastic elastomer, carbon fiber, or the like.

Figure 7:
FIGS. 5-7 show some individual pieces used to make the case.
Figure 6:
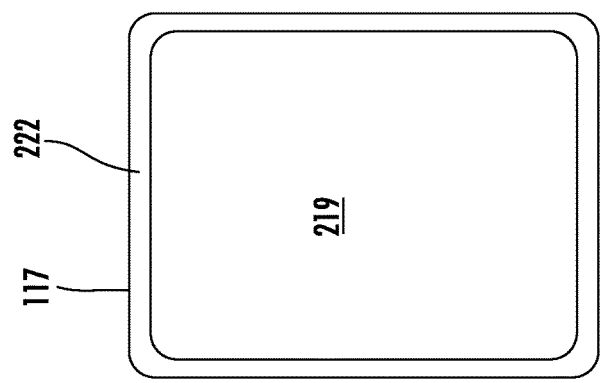
Figure 5:
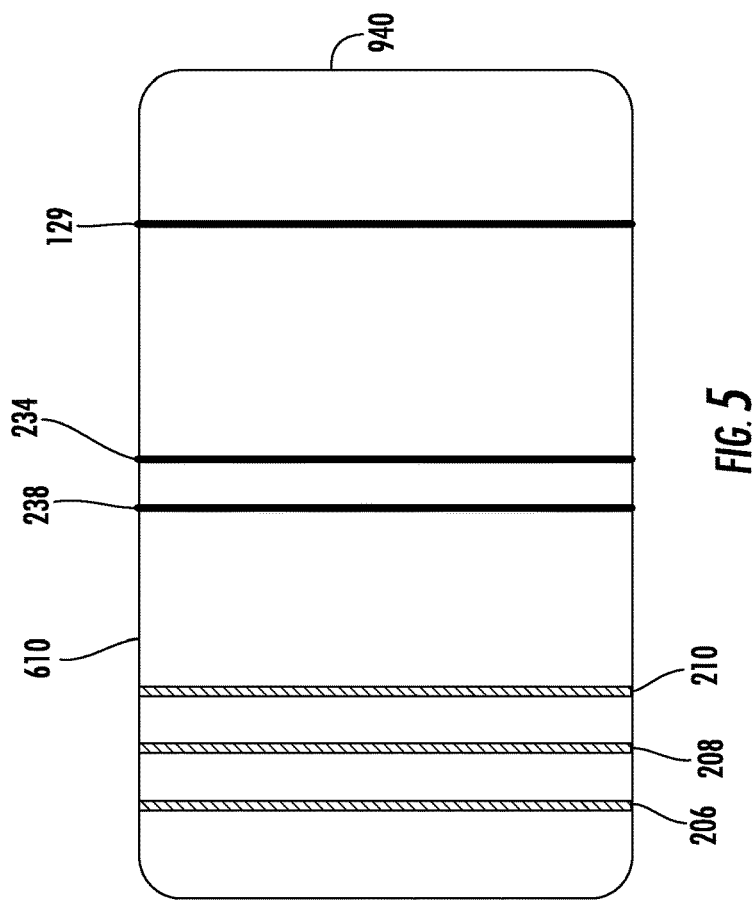

The table below provides a specific example of a flow for making the case. In conjunction with the table, FIGS. 5-9 show the case at specific points in the flow. FIG. 5 shows a front view of an outer cover 610 which forms the front and back flaps and spine panel of the case. FIG. 6 shows a front view of sleeve 117. FIG. 7 shows a front view of elastic band 103. FIG. 8 shows a top view of the assembled pieces of the case. FIG. 9 shows a cross section of the assembled pieces of the case.

It should be understood that the invention is not limited to the specific flows and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data or situation.

about 430 millimeters (about 16.9 inches) and a width of at least about 250 millimeters (about 9.8 inches). The length of material may be about at least twice or two times the width of the front or back flap. A single sheet layer may be used. For example, the single layer may be a thermoplastic or other plastic or polymer.

Alternatively, multiple or composite sheets or layers may be used. Leather, synthetic leather, or vinyl can be used to sandwich a more rigid material or stiffening layer, such as flexible plastic or cardboard. An additional layer may be a foam or other padding material. A foam or padding layer can help to provide cushioning for the electronic device. There can be layers other than those described above.

For example, there can be first and second flexible layers and four rigid or stiffening (or padding such as foam, or both) layers. The rigid layers are to be sandwiched between the first and second flexible layers. The rigid layers will form the front and back flaps and spine panel of the case. The first flexible layer will form the outside surface of the case. The second flexible layer will form the inside surface of the case. The first and second flexible layers have about the desired dimensions of the outer cover when the outer cover is laid flat and open. The composite layers can be combined or attached together by stitching, adhesives, bonding, glue, fusing, or the like.

In step 2, hinges are formed in the outer cover. In a specific implementation, to make a hinge, the first and second flexible layers are sealed or otherwise fused together to form a seam. On one side of the seam there is one rigid layer and on another side of the seam there is another rigid layer. The seam forms the crease hinge (or fabric hinge) and the rigid layers can swing about the flexible material of the crease hinge.

More specifically in this specific implementation, in a substep 2a, a rigid layer representing the front flap is placed on the first flexible layer. In a substep 2b, a rigid layer representing the spine panel is placed on the first flexible layer. The spine panel rigid layer is placed next to or adjacent to the front flap rigid layer. In a substep 2c, the second flexible layer is placed over the rigid layers and the first flexible layer. In a substep 2d, the first and second flexible layers are sealed together to form a seam. The front flap rigid layer is on one side of the seam. The spine panel rigid layer is on an opposite side of the seam. The seam forms the crease hinge, i.e., crease hinge 238 and the front flap and spine panel can swing about the crease hinge. Other hinges 234 and 129 can be made similarly to hinge 238.

In a specific implementation, the hinges show as visible crease lines in the outer cover. The material (e.g., plastic, fabric, or leather) at the crease line can be flexed in a hinge-like fashion—allowing flaps or panels connected by a hinge to swing or rotate with respect to each other.

TABLE

Step 1 Form outer cover 610. See FIG. 5.
Step 2 Make hinges 238, 234, and 129 in outer cover. This divides the outer cover into the front flap, back flap, and spine panel. See FIG. 5.
Step 3 Make grooves 206, 208, and 210 in outer cover. See FIG. 5.
Step 4 Form sleeve 117. See FIG. 6.
Step 5 Create bezel of sleeve, and slot and latch. See FIG. 6.
Step 6 Position sleeve on back flap. Position ends of elastic band (FIG. 7) between sleeve and back flap. FIG. 8 shows a top view, while FIG. 9 shows a cross section.
Step 7 Attach sleeve, elastic band, and outer cover to finish the case.

In step 1, to form outer cover 610, there is a rectangular sheet of material cut to the desired dimensions to form the case. For example, a length of the material may be at least Other hinges and techniques of forming hinges may be used in a case of the invention. Some hinges include fabric hinges, living hinges, piano hinges, continuous hinges, butt hinges, butterfly hinges, flush hinges, barrel hinges, concealed hinges, and spring hinges. The hinge can be made from materials including fabric, leather or other natural skin materials, synthetic leather, microfiber or polyester, metal (e.g., brass), plastic (e.g., polypropylene, polyethylene, or thermoplastic), rubber, silicone, carbon fiber, and others.

Other hinge techniques may not result in visible creases in the material. These hinges may be referred to as invisible or hidden hinges, but these hinges allowing flaps or panels connected by a hinge to swing or rotate with respect to each other.

In step 3, grooves are formed in the outer cover. These grooves are used to hold the edge of the sleeve when the case is used as a stand in the landscape orientation. Each groove is an indentation, which the sleeve edge can rest in, to prevent the sleeve from sliding backwards or forwards on flat base surface 228. The groove projects into or below the inside surface of the base surface. A depth of the groove is less than a thickness of the front flap. A groove may also be also referred to as a channel, recess, cavity, depression, indentation, notch, passage, furrow, slot, or flute. Typically, each groove is formed as a line (206, 208, and 210) that extends across the entire base surface as shown in FIG. 5.

To make the grooves, the material in the base surface of the front flap is depressed (or compressed together) to result in a plastic deformation. This may be done by a pressing a hard material (e.g., metal) at the position of a groove.

In another implementation, making the grooves may use a technique similar to making the hinges. In a specific implementation, to make the grooves the outside and inside flexible layers are not sealed together at the grooves. This is so that at the grooves the front flap remains rigid and resists bending about the grooves. Rather, the rigid front flap layer will form the base of the grooves. There are additional layer strips on each side of the groove which define the walls or sides of a groove.

More specifically in this specific implementation, in a substep 3a, a first additional layer strip is placed on the rigid front flap layer. In a substep 3b, a second additional layer strip is placed on the rigid front flap layer. The second additional layer strip is placed next to and is spaced apart from the first rigid layer strip. The spacing between the additional layer strips indicates a width of the groove to be made. In a substep 3c, the inner flexible layer is placed over the rigid front flap layer and the first and second additional layer strips. In a substep 3d, the inner flexible layer is sealed together with the rigid front flap layer to form a groove. The first and second additional layer strips are on either side of the groove and the thickness of the additional layer strips form the walls of the groove. The rigid front flap layer forms the base of the groove. The other grooves may be formed using a similar technique.

The grooves act as a stop mechanism or edge stop to hold the sleeve and prevent the sleeve (and thus electronic device) from slipping or sliding out of place. Specifically, grooves hold the sleeve in the various viewing angles shown in FIGS. 2D-2F. With the grooves, the user does not have to physically hold or touch the case to keep the device in a selected viewing angle.

Other stop mechanisms may be used to retain the edge of the sleeve to prevent the sleeve from sliding and keep the sleeve stationary at the selected viewing angle. These other mechanisms may be used instead of or in combination with grooves. For example, in another specific implementation, there are one or more rails or other projections that emerge or project above flat base surface 228. The projections may be protrusions, anchors, levees, studs, posts, and the like.

In an implementation, the projection is an extra layer of material attached to the base surface. For example, a strip of material is attached (e.g., glued or fused) onto the flat base surface to form the rails. There may be three rails to prevent the sleeve from sliding forward. In this implementation, the projection and front flap are two separate pieces of material. Alternatively, the rails or projections may be molded as part of the flat base surface.

Also, the strips of material may attached to an inner layer of the rectangular sheet of FIG. 5. Then, the outer layer will also have a protrusion caused by the inner strips of material.

In this specific implementation, the projection extends in a direction across flat base surface, similarly to the groove lines as shown as FIG. 5. The projection or rail may extend as a single line from one edge of the base surface the opposite edge. A length of the projection will be about the same as a length of the case.

However, in other implementations, the length of the projection is less than the length of the case. Specifically, the projection may be a single rail approximately centered between the two edges (where there are gaps between the edges and where the rail begins).

As a further example, the projection or rail can be a series of projections (e.g., analogous to a broken line with two or more segments). Also the projection can be one or more studs, posts, or buttons extending from the inside surface of the front flap to stop the sleeve from sliding. The projection may be referred to as a ridge or bump. The can be one or more of these posts used for each viewing position.

In a specific implementation, a thickness of a rail is less than or equal to a thickness of the bezel. Further, the rail is positioned on the front flap such that there is a first gap between a top edge of the flap and an end of the rail, and a second gap between a bottom edge of the flap and an opposite end of the rail. The lengths of the gaps are greater than or equal to a width of the bezel. This allows the front flap to be closed over the bezel where the thickness and location of the rail does not interfere with the inside surface of the front flap pressing against the bezel.

In another implementation, one or more rows of fasteners (e.g., buttons) are attached lengthwise along the inside surface of the front flap. In this specific implementation, the method includes providing a strip having a series of corresponding fasteners to act as the stop. The user can fasten the strip to the inside surface of the front flap and the sleeve will butt against the fastened strip to act as a stop at the desired viewing angle.

There can be an extra layer of material added to the base surface to act as the stop mechanism. There can be one or more flaps of material added to the base surface to make inner sleeves (which can also be used to hold papers) for the case.

In step 4, to form the sleeve 117, a rectangular sheet of material cut to the desired dimensions to form the backing (FIG. 4) of the sleeve. For example, a length of the backing may be at least about 250 millimeters (about 9.8 inches) and a width of at least about 190 millimeters (about 7.5 inches). The backing can be a single sheet layer or multiple layers, such as described for the outer cover described in step 1 above.

In an implementation having multiple layers, a suede surface of the backing is printed with a debossed pattern to provide a textured surface that will grip the electronic device. The suede surface is combined with a stiffening layer, and a sleeve back layer. The stiffening layer is sandwiched between the sleeve back layer and the suede layer, which will be against the back of the electronic device.

Sides of the sleeve are made from material. This side material may be die cut with openings appropriate for the electronic device. Other manufacturing techniques to make a hole include cutting, punching, or drilling. Case openings are further described in U.S. patent application Ser. No. 12/847,887 filed Jul. 30, 2010 which is incorporated by reference As previously discussed, the sleeve has bezel 222. In step 5, the sleeve backing, sleeve sides, and bezel are attached together. For example, they may be attached by stitching, an adhesive, bonding, or other.

One of the sides of the sleeve will remain open to allow for slot 247. The slot also has a latch 246. This latch may be a piece of material that will go across the slot, which will block the electronic device from dropping out of the slot. Latch 246 can have a width of material as shown in FIG. 2H, or the width of the latch may run the entire length of the slot.

In step 6, the sleeve is positioned on the back flap as shown in FIG. 8. FIG. 9 shows a cross-sectional view. Hinge 129 is shown using a broken line to indicate that it is behind the sleeve. In an implementation, ends of elastic band 103 (FIG. 7) are positioned between the sleeve and the back flap. The elastic band wraps around a top edge of the back panel, extends across an outside surface of the back panel, and wraps around a bottom edge of the back panel. The elastic band is oriented so that it runs parallel with the case hinges (FIGS. 8-9).

In step 7, the sleeve, elastic band, and outer cover are attached together to finish the case. In an implementation, the sleeve, elastic band, and outer cover are stitched together along the edges of the pieces, to the right of hinge of 129 (as represented in FIG. 8). Optionally, an adhesive or glue 925 (FIG. 9) may also be used between the back of the sleeve and outer cover. Alternatively, adhesive 925, without stitching, may be used to attach the pieces of the case together.

Between hinge 129 and 234, this portion of the outer cover is not attached to the sleeve. Not fixing the sleeve to the movable back flap portion allows the movable back flap to swing or move independently of the sleeve and allows the sleeve to be positioned at the desired viewing angle, working angle, or both. Hinge 129 is not attached to the sleeve so that it can swing and rotate freely.

In an implementation, the elastic band is provided as a strip, i.e., having an end and an opposite end. In another specific implementation, the elastic band is provided as a loop, i.e., a continuous strip or circle of band material.

The band may be referred to as a belt, strap, strip, or cord. Typically, the band is thin so that it remains unobtrusive. A cross section of the band is rectangular and when viewed in cross section the band has a length that is substantially greater than a width. Alternatively, the band can be thick. The band can have a square cross section or a circular cross section (e.g., bungee cord).

In a specific implementation, the band includes an elastic type material that is capable of being easily stretched and recovering size and shape after deformation. The band may include materials such as rubber, silicone, gum, latex, cloth, fabric, nylon, leather, or combinations of these. Alternatively, the band may be designed so that it is not to be stretched like a rubber band. In this specific implementation, the band may be webbing, i.e., a strong narrow closely woven fabric. Buckles, hook-and-loop fasteners, buttons, and the like may be provided so that the band webbing can removably secure the front flap to the back flap.

FIG. 8 shows a top view of an open case. In an implementation, grooves 206, 208, and 210 are approximately equally spaced from each other. The viewing angles the case provides for include about 45, 60, and 75 degrees. The working viewing angle is about 8 degrees. In another specific implementation, the viewing angles are about 34, 50, and 60 degrees.

However, in other implementations, the grooves are not equally spaced from each other. Also the viewing angles will be different from those listed above. The selected viewing angle will be between about 0 degrees and about 90 degrees, such as 30, 31, 32, 33, 34, 35, 36, 37, 38, 39, 40, 45, 46, 47, 48, 49, 50, 51, 52, 53, 54, 55, 56, 57, 58, 59, 60, 61, 62, 63, 64, 65, 70, 75, 80, or 85 degrees (or any combination of these). The working viewing angle can range from about 5 degrees to about 15 degrees, such as 6, 7, 8, 9, 10, 11, 12, 13, or 14 degrees.

Referring to FIG. 9, the sleeve has slot or side opening 247 which is indicated by the dashed lines. A removable latch (shown in FIG. 2H) spans across the slot to removably secure the electronic device within the sleeve. The slot is on a side of the sleeve that is nearest to the spine panel. A length of the slot is parallel with a length of the case, elastic band, or both.

When the case is closed as shown in FIG. 1A the slot will be covered by the spine panel of the case. This location of the slot with respect to the sleeve sides allows for a relatively small amount of latch material to be used, but still allows the slot to be covered when the case is closed, thus protecting the electronic device. For example, when the latch is closed the side of the electronic device is still visible through the slot. When the case is closed the slot will be covered by the spine panel and the side of the electronic device will not be visible.

Using a small amount of latch material lowers the overall cost of the case because less material is used as compared to having a latch that completely covers the slot. Using less material also makes the case less heavy which makes the case easier to carry.

It should be appreciated that the slot can be located on any side of the sleeve. In another specific implementation, the slot is located on a side of the sleeve opposite from the side shown in FIG. 9. That is, the slot is on a side of the sleeve nearest the elastic band, furthest from the spine panel, or both. In another specific implementation, the slot is located on a side of the sleeve transverse to the side shown in FIG. 9. That is, a length of the slot is transverse or perpendicular to the length of the case, the elastic band, or both. The length of the slot is parallel with a width of the case.

Further, the latch for the slot shown in FIG. 2H is merely one type of retention mechanism that may be used to removably secure the electronic device within the sleeve. Other retention mechanisms may be used instead of or in addition to the latch and hook-and-loop fastener shown in FIG. 2H. For example, in another specific implementation, one or more buttons are used instead of the Velcro so that the latch is removably snapped across the slot. In another specific implementation, the retention mechanism includes a long flap that extends out from the bezel, wraps around the side of the electronic device, and tucks under the electronic device to removably secure the device within the sleeve. In another specific implementation, a zipper is stitched or otherwise attached to the slot to open and close the slot.

The case has a band to hold front flap of the case against the sleeve when in the closed position. FIGS. 1A and 8-9 show the positioning of band 103. Referring to FIG. 9, the band is positioned between hinge 129 and a right side edge 940 of the outer cover. Generally, the band is positioned so that it is closer to the right side edge than hinge 129. This allows for the user to more easily pull the band over the front flap.

In an implementation, when the case is closed as in FIG. 1A, the band rests on the front flap at a position further away from the spine than an edge 955 opposite the spine. A distance from edge 955 to the band will be greater than a width of the band, and greater than a distance from the band to the spine.

In an implementation, the band has a width of about 20 millimeters units and the distance from edge 955 to the band is about 25 millimeters, where the front flap is about 200 millimeters. So the band is about 10 percent of the front flap, and edge 955 to the band is about 125 percent of the band width. The percentages can vary such as 6 to 15 percent for the band width, and 100 to about 150 percent for edge 955 to the band.

In implementation, a distance from edge 955 to the band is in a range from about 5 to 10 millimeters, about 15 to 30 millimeters, or up to about 80 millimeters from the edge. These distances allows for ease in slipping on and off the band, but is also a sufficient distance so the band does not accidently slip off.

Since the band is attached to the case, the band is unlikely to become lost or misplaced. The positioning of the band allows the band to be easily pulled over the right side edge of the back flap to secure and unsecure the front flap to the back flap. As shown in FIG. 2H, the band holds the back flap together for the working angle.

In an implementation, as shown in FIG. 9, ends of the band are attached between the sleeve and the outer cover. In other implementations, the ends of the band may be attached at different points of the outer cover. For example, the band may be attached at points on the back flap 119 of FIG. 1B (such as part 241 of FIG. 2H). The band may be attached at points on an inside of back flap 119.

In an implementation, the band can be a continuous piece or loop of material. There can be multiple bands, e.g., two or more elastic bands. The band loop can be attached to the case using one or more rivets or other fastening means to the back flap.

FIG. 8 shows positioning of hinge 129 behind the sleeve. For example, this position may be about 80 millimeters from the edge 940, where an overall length of the back flap is 200 millimeters. Therefore, hinge 129 is closer to edge 940 than hinge 234 (or the spine). The hinge may be positioned at about 40 percent of the length of the back flap. So about 40 percent of the flap is attached to the sleeve, while about 60 percent is unattached.

In various implementations, the positioning of the hinge behind the sleeve can vary. For example, the hinge may be positioned from about 25 to about 75 percent the length of the back flap (e.g., 30, 33, 45, 60, or other percent).

In a further implementation of the case, hinge 129 is positioned at edge 940, so the entire back flap is not attached to the sleeve except at the hinge. With this positioning of hinge 129, viewing angles 1, 2, and 3 described above will be available, but the working angle will be omitted.

In a specific implementation, the cover includes a left, top, right, and bottom cover edges which may be referred to as first, second, third, and fourth cover edges. A front flap of the cover is from the first cover edge to hinge 238. The front flap has a first length from the first cover edge to hinge 238 that is sufficiently long to cover a front screen of the electronic device when the front flap is folded via the first hinge to close the case. A second length is from the third cover edge to hinge 129. A third length is from hinge 129 to hinge 238.

In a specific implementation, the third length is greater than the second length. In another specific implementation, the third and second length are equal. In another specific implementation, the second length is greater than the third length.

In a specific implementation, a sum of the first, second, and third lengths is at least about 407 millimeters. A length of hinge 238 is at least about 245 millimeters. These dimensions can vary depending upon the case materials, the portable electronic device the case is designed to hold, or both.

Some specific techniques for attaching materials have been described in this application. However, any attachment technique or mechanism may be used to attach or bond the case pieces together. Attachment may be by way of an adhesive such as a glue (e.g., fabric glue) or epoxy. To help facilitate bonding, a bonding agent can be used. For example, portions or the entire surface of the fixed back flap can include a temperature activated adhesive that helps bond the sleeve and back flap together when heat, pressure, or both is applied. Such an adhesive can be in the form of a coating, powder, or lacquer, such as a heat sealing lacquer. Sufficient heat is applied in order to bring the temperature up to or above the activation temperature of the adhesive. Curing can occur upon cooling. Using such a bonding or adhesive process to make the case allows the case to be made quickly and cost effectively and very little labor is used.

Attachment may be by way of stitches or stitching. In this specific implementation, in a first attachment step, the sleeve is positioned over the back flap. In a second attachment step, the sleeve is stitched to the fixed back flap, but is not stitched to the movable back flap. The stitching process may include using a needle and thread. The stitching may be done using a sewing machine or may be done by hand.

Attachment may be by way of rivets. A rivet is a pin or bolt of material (e.g., metal) used for uniting two or more pieces. One end of the rivet shank has a head and an opposite end of the shank has a plain end. The plain end passes through a hole in each piece. The diameter of the head is larger than the diameter of the hole so that the rivet can not pass completely through. After passing the plain end through the hole, the plain end is beat or pressed down so as to make an another head having a diameter larger than the diameter of the hole—thus securing the material pieces together between the heads.

Attachment may be by way of welding such as plastic welding or radio frequency (RF) bonding to seal or bond the sleeve to the fixed back panel portion, but not the movable back panel portion. Some examples of specific welding techniques that may be used include hot gas welding, freehand welding, speed tip welding, extrusion welding, contact welding, hot plate welding, high frequency welding, injection welding, ultrasonic welding, friction welding, spin welding, laser welding, or solvent welding.

These techniques are intended to create a permanent bond between the sleeve and the fixed back flap. However, in another implementation, the attachment mechanism permits the user to separate the sleeve from the back flap or outer cover. For example, the user may remove a sleeve from a first outer cover. The user may then attach the sleeve to a second outer cover, different from the first outer cover. For example, a color of or image on the first outer cover may be different from a color of or image on the second outer cover. Such a feature can be used to permit the user to coordinate or match the color of their clothes with the color of the case.

The feature can also allow the user to replace just the outer cover (and keep the sleeve) when the outer cover becomes damaged or worn.

In this specific implementation, an attachment includes a hook-and-loop attachment mechanism (e.g., Velcro). Other nonpermanent attachment mechanisms that allow the user to replace the outer cover include zippers, latches, buckles, buttons, straps, tongue and groove, and the like.

FIGS. 10-29 show various views of a second embodiment of a case for a portable electronic device. This second embodiment of a case may be referred to as a Convertible Maki Jacket™ or CMJ™ case with OP™ flap. Convertible Maki Jacket, CMJ, and OP are trademarks of Incase Designs Corp. OP refers to a polyurethane (PU) laminate with a polycarbonate (PC) reinforcement structure.

FIG. 10 shows a back perspective view of a closed case. FIG. 11 shows a front perspective view of the closed case. This case includes a thermoplastic polyurethane-polycarbonate (TPU-PC) frame construction. The case has an edge welded outer cover and can provide functionality and features similar to the first embodiment of the case described above. This construction allows for a thin, light, and durable design. Some features of the case include full hard shell protection, access to all ports, over-molded power and volume buttons, display protection, three different viewing angles, a working angle, and a rubber band closing mechanism.

FIG. 12-14 show the case being used a stand for the electronic device. FIG. 12 shows how a frame 1302 of the case can be adjusted to be placed into one of the three viewing angles. FIG. 13 shows a front perspective view of the case in one of the viewing angles.

The frame has a bezel and front opening defined by the bezel through which the screen of the electronic device will be visible. The electronic device is inserted into frame 1302 through the front opening. Unlike the sleeve of FIG. 2A which has a slot 247 (FIG. 2H), frame 1302 has four sides without a slot into which to slide the electronic device. The sides of the frame have openings and over-molded buttons to allow access to the ports and buttons of device.

The frame is made from an elastic material which allows the frame to be stretched around the sides of the electronic device. The electronic device may be fitted into the frame through the front opening of the bezel by peeling back the bezel so as to enlarge the front opening. The electronic device can be fitted into the enlarged front opening. Upon releasing the bezel, the bezel can recover its former size so as to hold the electronic device. In this specific implementation, the bezel is made of an elastic material (e.g., rubber, latex, or silicone) to permit the bezel to be stretched.

Compared to grooves 206, 208, and 210 in the FIG. 2A embodiment, this embodiment uses over-molded rails 1305 as edge stops. The rails are over molded on the base surface or the inside surface of the front flap. In a specific implementation, there are three rails, but as was the case for the grooves, there can be more rails (to support a greater number of viewing angles), fewer rails, or a combination of rails and grooves.

Each rail is formed as a line that extends across at least a portion of the base surface as shown in FIG. 13. Although possible, each rail does not necessarily extend entirely across the base surface. A single rail can stop the edge of the frame from sliding in one direction (e.g., forwards) along the base surface when the frame edge butts up against the rail. In comparison, a single groove can prevent the sleeve from slipping in two directions (e.g., forwards and backwards).

FIG. 14 shows a back perspective view of the case in one of the viewing angles. The frame has a full thermoplastic polyurethane (TPU) back 1410. The frame is attached to the back flap by adhesion. For example, the frame can be attached to the outer cover by using an adhesive, bonding, fusing, or other adhesion technique. An adhesion area 1405 (OP to thermoplastic elastomer (TPE)) indicates the attachment of the frame to the back flap.

When the case is folded into a stand as shown in FIG. 14, a back of the electronic device is still protected because the back remains covered or completely covered by the backing of the frame.

Figures 15, 16:
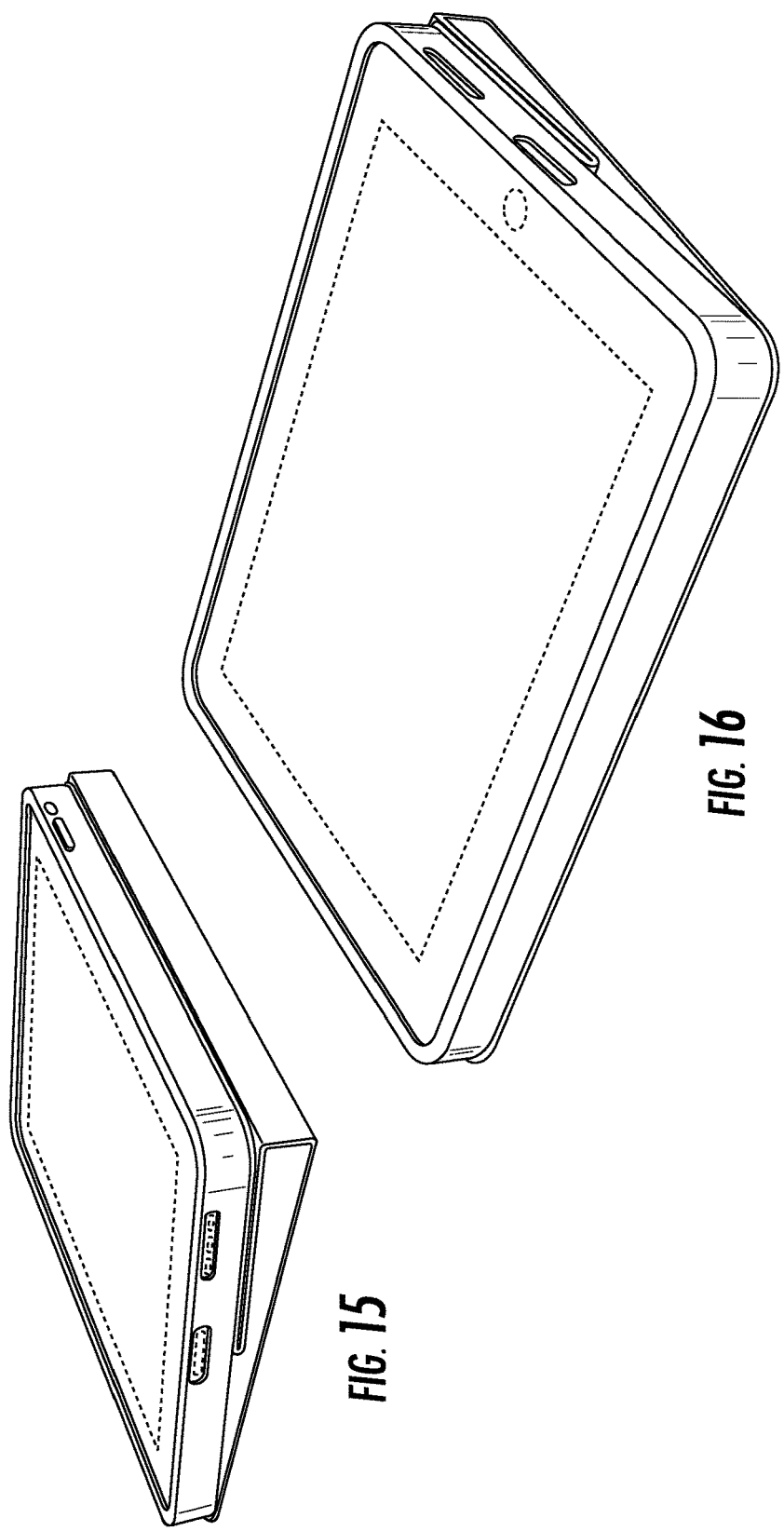

FIG. 15 shows a back perspective view of the case folded into the working angle.

FIG. 16 shows a front perspective view of the case folded into the working angle. In this specific implementation, the working angle is about 6 degrees. However, as was in the first embodiment of the case, this angle can vary.

FIG. 17 shows an outside view of the case. FIGS. 18-21 show various side, bottom, and top views of the case. Referring to FIG. 17, the case includes three hinges 1705, 1710, and 1715 and a rubber strap 1720 attached to the back flap. Case outer cover 1730 is made of the OP material with reinforced polycarbonate (PC) panels that are edge welded. There can be a printed logo on the outside surface of the front flap.

For the case in FIGS. 10-29, the frame is made from a different material than the outer cover. The frame is a thermoplastic elastomer with polycarbonate back. The outer cover is an edge-welded polymer with polycarbonate panels. Alternatively, the frame can be made from thermoplastic polyurethane. Or the thermoplastic elastomer frame can include thermoplastic polyurethane. By adhering the back of the frame to the outer cover, this forms a composite of the layers of different materials. In a specific implementation, the case is made from a polyurethane (PC) laminate with a polycarbonate (PU) reinforcement structure. The case hinges in the thin areas where the laminate is not reinforced with polycarbonate.

FIG. 18 shows a top view of the case. A width of the frame is about 194 millimeters (about 7.6 inches). FIG. 19 shows a bottom view of the case.

FIG. 20 shows a side view of the case. The case includes frame or frame case construction 1302 to removably secure the electronic device. The frame has over-molded buttons 2005 to access controls of the electronic device. The device's buttons will be positioned underneath the case's over-molded buttons. The case's over-molded buttons are made from a flexible material that allows them to be pressed and also cause pressing the device's buttons.

FIG. 21 shows a side view of the spine panel. There can be a printed leaf logo on a side of the case. A length of the case is about 246 millimeters (about 9.7 inches). A thickness of the case is about 22 millimeters (about 0.9 inches)—FIG. 20. The Incase lettering, logo, and leaf logo shown in the figures are trademarks of Incase Design Corp.

FIG. 22 shows an inside view of the case. FIGS. 23-26 show various side, bottom, and top views of the case.

Referring to FIG. 22, frame 1302 is of a thermoplastic polyurethane-polycarbonate (TPU-PC) frame case construction. The frame includes a thermoplastic polyurethane (TPU) protective spine 2220 that is co-molded to a back of the frame. The protective spine can help to grip the back of the electronic device, and also prevent scratching of the back. The back or interior surface 2225 of the frame is a polished polycarbonate (PC) interior. As discussed above, outer cover 1730 is made of the OP material with reinforced polycarbonate (PC) panels that are edge welded. Thermoplastic polyurethane (TPU) over-molded rubber rails 1305 project from the inside surface of the front flap to allow the frame to be positioned into a viewing angle. There can be a printed logo on the inside surface of the front flap.

FIG. 25 shows a side view of the case with printed leaf logo.

FIG. 27 shows a close-up view of a closed case. In this specific implementation, outer cover 1730 is edge welded and is made with the OP material. The outer cover edge can have a chamfer (e.g., furrow or groove) extending around the perimeter of the outer cover. The edge may be beveled or tapered. The cover is a composite of materials, i.e., is made of two or more different materials. An inner layer of the cover can be a rigid material (e.g., polycarbonate). The inner layer may be between two outer layers made of a rubberized material.

Also shown in FIG. 27 is rubber strap 1720 to removably hold the front flap over frame or frame case construction 1302 and over-molded buttons 2005 on a side of the frame to allow controls of the electronic device to be accessed.

The case can be made in any color, combination of colors (e.g., black, blue, white, or pink), combination of hues or shades (e.g., light blue or dark blue), or combinations of colors and hues. FIG. 27 shows a case having an outer cover, rubber strap, and frame that are in the same color (e.g., black). FIG. 28 shows a case having an outer cover and rubber strap in a first shade of a color (e.g., blue), and a frame in a second shade of the same color (e.g., light blue), different from the first shade or hue. FIG. 29 shows a case having an outer cover and rubber strap in a first color (e.g., white), and a frame in a second color (e.g., pink) different from the first color.

FIGS. 30-42 show various views of a third embodiment of a case for a portable electronic device. This third embodiment of a case may be referred to as a Convertible Maki Jacket™ or CMJ™ case with thermoplastic polyurethane (TPU) flap. This case includes a thermoplastic polyurethane-polycarbonate (TPU-PC) frame construction with a thermoplastic polyurethane molded cover. This construction provides a thin, light, and durable design. This case can provide functionality and features similar to the first embodiment of the case described above. Some features of this case include full hard shell protection, access to all ports, over-molded power and volume buttons, display protection, three different viewing angles, a working angle, and a rubber band closing mechanism.

FIG. 30 shows an outside view of the case. FIGS. 31-34 show various side, bottom, and top views of the case. Referring to FIG. 30, this case is similar to the second embodiment of the case described above. However, outer cover 3005 of this case is made of a thermoplastic polyurethane material. The cover is formed from a thermoplastic polyurethane mold. In this implementation, unlike for case the FIGS. 10-29 where the cover is a composite material (e.g., thermoplastic polyurethane and polycarbonate), the outer cover is made of a single type of material—thermoplastic polyurethane. In an alternative implementation, the single type of material is an thermoplastic elastomer.

The case includes hinges 3010, 3015, and 3020, and a rubber strap 3025. An outside surface of the front flap can include a debossed logo.

FIG. 31 shows a top view of the case. FIG. 32 shows a bottom view of the case.

FIG. 33 shows a side view of the frame and over-molded buttons 3305. FIG. 34 shows a side view of the spine panel and a debossed leaf logo on the spine panel.

A width of the frame is about 194 millimeters (about 7.6 inches)—FIG. 31. A thickness of the case is about 22 millimeters (about 0.9 inches)—FIG. 33. A length of the case is about 246 millimeters (about 9.7 inches)—FIG. 34.

FIG. 35 shows an inside view of the case. FIGS. 36-39 show various side, bottom, and top views of the case. FIG. 36 shows a top view. FIG. 37 shows a bottom view. FIG. 38 shows a side view of the spine panel. FIG. 39 shows a side view of the frame.

Referring to FIG. 35, this figure shows outer cover 3005 (including the rails) which, as discussed above, is made from a thermoplastic polyurethane (TPU) material. There are rails 3510 projecting from an inside surface of the front flap. These rubber rails are part of the mold used to make the outer cover. Frame 3515 can made of using a thermoplastic elastomer-polycarbonate (TPE-PC) frame case construction. The thermoplastic elastomer-polycarbonate is a different material from the thermoplastic polyurethane material of the outer cover. These different materials are attached in the adhesion region shown in FIG. 14 to form a composite.

Alternatively, the frame can be made from a thermoplastic urethane-polycarbonate (TPU-PC) frame case construction. The material of the outer cover is the same as the material of the frame, except for the polycarbonate. The polycarbonate can be optional, and omitted in some implementations, to form an entirely thermoplastic urethane version.

In another implementation, the outer cover (including the rails) are made from a thermoplastic elastomer (TPE) material via a mold. Frame 3515 can made of using a thermoplastic elastomer-polycarbonate (TPE-PC) frame case construction. The material of the outer cover is the same as the material of the frame, except for the polycarbonate. The polycarbonate can be optional, and omitted in some implementations, to form an entirely thermoplastic elastomer version.

Alternatively, the frame can be made from a thermoplastic urethane-polycarbonate (TPU-PC) frame case construction. The material of the outer cover is different from the material of the frame. These different materials are attached in the adhesion region shown in FIG. 14 to form composite.

The frame includes a thermoplastic elastomer (TPE) protective spine 3520 that is co-molded and has a polished polycarbonate (PC) interior 3525. A debossed logo is on the inside surface of the front flap. Debossed leaf logo is on the outside surface of the spine panel.

FIG. 40 shows a close-up view of a closed case. As described above, outer cover 3005 can be made of a thermoplastic polyurethane material. Alternatively the outer cover may be made from a thermoplastic elastomer (TPE) material. This outer cover has a non-chamfered or straight edge (without a bevel) as compared to the edge in the second embodiment of the case. Also shown in FIG. 40 is rubber strap 3025, over-molded buttons 3305, and frame 3515.

As discussed above, the case can be made in any color, combination of colors, combination of hues, or combinations of colors and hues. FIG. 40 shows a case having a black outer cover, rubber strap, and frame. FIG. 41 shows a case having a blue outer cover and rubber strap, and a light blue frame. FIG. 42 shows a case having a white outer cover and rubber strap, and a pink frame.

Figure 43:
FIGS. 43-44 show a comparison of thickness between the first and second case embodiments.
Figure 44:
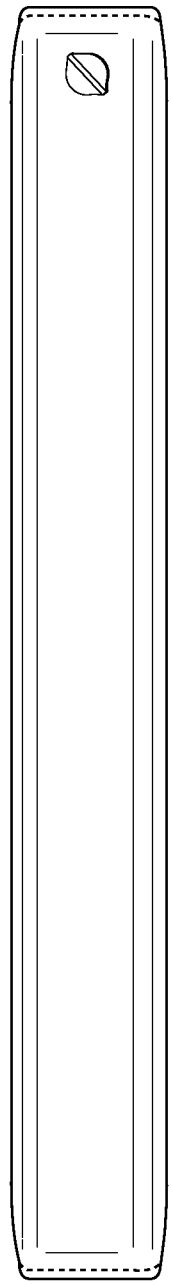

FIGS. 43-44 show a comparison of the thicknesses of two of the case embodiments. FIG. 43 shows a side of the second embodiment of the case. This case has a thickness of about 22 millimeters (about 0.9 inches). FIG. 33 shows a side of the first embodiment of the case. This case has a thickness of about 30.5 millimeters (about 1.2 inches).

It should be appreciated that the case sleeve (FIG. 2A) and case frame (FIGS. 13 and 35) are merely examples of how the electronic device may be retained against the cover. Any retaining mechanism may be used to removably hold the electronic device against the cover so long as a portion of the back flap can be folded away from the electronic device so that the cover can be folded into a stand. In a specific implementation, a set of clips attached to the cover is used to removably hold the electronic device against the cover. In this specific implementation, a first clip is attached to the second cover edge, and a second clip is attached to the fourth cover edge. The first clip is positioned along the second cover edge so that it is between the first hinge and the third cover edge. The second clip is similarly positioned on the fourth cover edge. That is, the second clip is positioned along the fourth cover edge so that it is between the first hinge and the third cover edge. The first hinge will be behind the electronic device when the electronic device is in the case.

This position of the first and second clips allows the back flap (or the portion of the back flap not connected to the electronic device) to be folded away from the electronic device via the first hinge when folding the case into a stand.

In a specific implementation, the clips are rigid. To insert the electronic device into the case, the electronic device is slid underneath the clips in a direction from the first hinge towards the third cover edge. In this specific implementation, the cover includes one or more guards or stops to prevent the electronic device from sliding past the third cover edge. In a specific implementation, there are two guards. A first guard is attached to a first corner of the cover defined by the intersection of the second and third cover edges. A second guard is attached to a second corner of the cover defined by the fourth and third cover edges. A guard may be placed anywhere along the third cover edge to stop the electronic device from sliding past the third cover edge. A guard may be referred to as a bumper, corner guard, wall, or tab.

In another specific implementation, the clips are bendable or flexible. To insert the electronic device the clips are bent around an edge of the electronic device. Upon release of the clip, the clip recovers its previous form. A clip may be referred to as bracket, grip, claw, pincher, or hook.

In a specific implementation, a case cover includes a set of grooves and a clasp. The clasp is attached to the first cover edge. The clasp can act as a stop for the electronic device and provide one of the viewing or working angles. The clasp can also act as a closure mechanism to hold the front and back flaps of the case together when the case is closed. For example, the clasp can be removably fastened to the third cover edge. In this specific implementation, the clasp is designed to snap in and out of place and is made of a flexible material. In another specific implementation, a strap having a button, Velcro, or both is used to fasten the front and back flaps of the case together when the case is closed.

In a specific implementation, there are four grooves and a clasp. The clasp and grooves allow the electronic device to be positioned at one of five different angles. The clasp provides the angle having the most slope. Although in this specific implementation there are four grooves, as discussed above, there can be any number of grooves.

A case as described in this application may be referred to as a portfolio, a portable electronic device enclosure, wallet, container, folder, folding case, pocketbook, folding pocketbook, box, jacket, or envelope. The case may include one or more pockets. The pockets can be used to hold pens, pencils, papers, business cards, credit cards, money, accessories for the portable electronic device (e.g., stylus), and so forth.

A sleeve, frame, or both as described in this application may be referred to as a portable electronic device holder, enclosure, container, or receptacle.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
    forming a rectangularly shaped cover for a portable electronic device comprising first, second, third, and fourth cover edges, wherein the first and third cover edges extend in a first direction and are parallel to each other, the second and fourth cover edges extend in a second direction and are parallel to each other, the second direction is transverse to the first direction, and the second cover edge is longer than the first cover edge;
    forming a first hinge in the cover between the first and third cover edges, extending in the first direction, and the cover from the first cover edge to the first hinge is a front flap, and the front flap has a first length from the first cover edge to the first hinge that is sufficiently long to cover a front screen of the portable electronic device when the front flap is folded via the first hinge to close the case;
    forming a second hinge in the cover, between the third cover edge and the first hinge, extending in the first direction, parallel to the first hinge,
    wherein a first back part is between the third cover edge and the second hinge, and a second back part is between the second hinge and the first hinge;
    forming a first structure, coupled to and extending at an angle away from the third cover edge, wherein when the portable electronic device is removably coupled to the cover, the first structure prevents an upper edge of the portable electronic device from sliding beyond the third cover edge; and
    allowing folding into a first stand position by rotating the second hinge in a first rotation direction so a lower edge of the portable electronic device is positioned on an inside surface of the front flap at a first point, and
    wherein the first back part remains fixedly attached to the first structure, alongside a back of the portable electronic device, while the second back part is rotated away from the back of the portable electronic device, and wherein the portable electronic device is removably coupled to the cover by inserting the portable electronic device along the inside surface of the cover in the second direction until the upper edge of the portable electronic device is stopped by at least a portion of the first structure.

2. The method of claim 1 comprising:
    allowing folding into a second stand position by rotating the second hinge in the first rotation direction so the lower edge of the portable electronic device is positioned alongside the inside surface of the front flap at a second point that is closer to the first cover edge than is the first point.

3. The method of claim 1 comprising:
allowing folding into a second stand position by rotating the second hinge in the first rotation direction so the lower edge of the portable electronic device is positioned alongside the inside surface of the front flap at a second point that is closer to the first cover edge than is the first point; and
allowing folding into a third stand position by rotating the second hinge in the first rotation direction so the lower edge of the portable electronic device is positioned alongside the inside surface of the front flap at a third point that is closer to the first cover edge than is the second point.

4. The method of claim 1 comprising:
forming a first groove on the inside surface of the front flap, wherein the first point is within the first groove.

5. The method of claim 1 comprising:
allowing folding into a second stand position by rotating the second hinge in the first rotation direction so the lower edge of the portable electronic device is positioned alongside the inside surface of the front flap at a second point that is closer to the first cover edge than is the first point;
forming a first groove on the inside surface of the front flap, wherein the first point is within the first groove; and
forming a second groove on the inside surface of the front flap, wherein the second point is within the second groove.

6. The method of claim 1 comprising:
forming a first protrusion on the inside surface of the front flap, wherein the first point is between the first hinge and the first protrusion.

7. The method of claim 1 comprising:
allowing folding into a second stand position by rotating the second hinge in the first rotation direction so the lower edge of the portable electronic device is positioned alongside the inside surface of the front flap at a second point that is closer to the first cover edge than is the first point;
forming a first protrusion on the inside surface of the front flap, wherein the first point is between the first hinge and the first protrusion; and
forming a second protrusion on the inside surface of the front flap, wherein the second point is between the first protrusion and the second protrusion.

8. The method of claim 1 comprising:
forming a second structure, coupled to and extending at an angle from the second cover edge at a position between the first hinge and the third cover edge, wherein when the portable electronic device is removably coupled to the cover, the second structure prevents a first side edge of the portable electronic device from sliding beyond the second cover edge.

9. The method of claim 1 comprising:
forming a second structure, coupled to and extending at an angle from the second cover edge at a position between the first hinge and the third cover edge, wherein when the portable electronic device is removably coupled to the cover, the second structure prevents a first side edge of the portable electronic device from sliding beyond the second cover edge; and
forming a third structure, coupled to and extending at an angle from the fourth cover edge at a position between the first hinge and the third cover edge, wherein when the portable electronic device is removably coupled to the cover, the third structure prevents a second side edge of the portable electronic device from sliding beyond the second cover edge, and the second side edge of the portable electronic device is opposite of the first side edge.

10. The method of claim 1 comprising:
allowing folding into a second stand position by rotating the second hinge in the first rotation direction so the lower edge of the portable electronic device is positioned alongside the inside surface of the front flap at a second point that is closer to the first cover edge than is the first point; and
forming at least a first groove and a second groove on the inside surface of the front flap, wherein the first and second stand positions are formed using the at least first and second grooves, the first point for the first stand position is within the first groove, the second point for the second stand position is within the second groove, and the second groove is positioned next to the first groove, without any intervening grooves in between the first and second grooves.

11. The method of claim 1 comprising:
allowing folding into a second stand position by rotating the second hinge in the first rotation direction so the lower edge of the portable electronic device is positioned alongside the inside surface of the front flap at a second point that is closer to the first cover edge than is the first point, wherein the second point is closer to the first cover edge than to the first hinge.

12. The method of claim 7 wherein between the first and second protrusions is a groove.

13. The method of claim 10 wherein between the first and second grooves is a protrusion.

14. A method comprising:
forming a rectangularly shaped cover for a portable electronic device comprising first, second, third, and fourth cover edges, wherein the first and third cover edges extend in a first direction and are parallel to each other, the second and fourth cover edges extend in a second direction and are parallel to each other, the second direction is transverse to the first direction, and the second cover edge is longer than the first cover edge;
forming a first hinge in the cover between the first and third cover edges, extending in the first direction, and the cover from the first cover edge to the first hinge is a front flap, and the front flap has a first length from the first cover edge to the first hinge that is sufficiently long to cover a front screen of the portable electronic device when the front flap is folded via the first hinge to close the case;
forming a second hinge in the cover, between the third cover edge and the first hinge, extending in the first direction, parallel to the first hinge,
wherein a first back part is between the third cover edge and the second hinge, and a second back part is between the second hinge and the first hinge;
forming a first structure, coupled to and extending at an angle away from the third cover edge, wherein when the portable electronic device is removably coupled to the cover, the first structure prevents an upper edge of the portable electronic device from sliding beyond the third cover edge;
forming a second structure, coupled to and extending at an angle from the second cover edge at a position between the first hinge and the third cover edge, wherein when the portable electronic device is removably coupled to the cover, the second structure prevents a first side edge of the portable electronic device from sliding beyond the second cover edge;

forming a third structure, coupled to and extending at an angle from the fourth cover edge at a position between the first hinge and the third cover edge, wherein when the portable electronic device is removably coupled to the cover, the third structure prevents a second side edge of the portable electronic device from sliding beyond the second cover edge, and the second side edge of the portable electronic device is opposite of the first side edge;

allowing folding into a first stand position by rotating the second hinge in a first rotation direction so a lower edge of the portable electronic device is positioned alongside an inside surface of the front flap at a first point, and the first back part remains fixedly attached to the first structure, alongside a back of the portable electronic device, while the second back part is rotated away from the back of the portable electronic device; and allowing folding into a second stand position by rotating the second hinge in the first rotation direction so the lower edge of the portable electronic device is positioned alongside the inside surface of the front flap at a second point that is closer to the first cover edge than is the first point, wherein the portable electronic device is removably coupled to the cover by inserting the portable electronic device along the inside surface of the cover in the second direction until the upper edge of the portable electronic device is stopped by at least a portion of the first structure.

15. The method of claim 14 comprising:
forming a first groove on the inside surface of the front flap, wherein the first point is within the first groove; and
forming a second groove on the inside surface of the front flap, wherein the second point is within the second groove.

16. The method of claim 14 comprising:
forming a first protrusion on the inside surface of the front flap, wherein the first point is between the first hinge and the first protrusion; and
forming a second protrusion on the inside surface of the front flap, wherein the second point is between the first protrusion and the second protrusion.

17. A method comprising:
forming a cover for a portable electronic device having first, second, third, and fourth cover edges, wherein the second and fourth cover edges are longer than the first and third cover edges;
forming first and second hinges in the cover,
wherein a first cover panel is between the third cover edge and the first hinge, a second cover panel is between the first hinge and the second hinge, and a front flap panel is between the first cover edge and second hinge, and
a first length is from the first cover edge to the second hinge, a second length is from the second cover edge to the fourth cover edge, and the second length is greater than the first length;
forming a first structure coupled to and extending at an angle from the third cover edge wherein when the portable electronic device is removably coupled to the cover, the first structure is against an upper edge of the portable electronic device;
allowing folding into a first stand position by rotating the first hinge a first angle in a first rotation direction, the second cover panel being rotated away from the portable electronic device, so a lower edge of the portable electronic device can be placed on an interior surface of the front flap panel at a first point; and
allowing folding into a second stand position by rotating the first hinge a second angle in the first rotation direction, the second angle being greater than the first angle, so the lower edge of the portable electronic device can be placed on the interior surface of the front flap panel at a second point, wherein the second point is closer to the first cover edge than to the second hinge, and
wherein in the first and second stand positions, the upper edge of the portable electronic device is positioned against the first structure, thereby maintaining a position of the portable electronic device against an inside of the first cover panel and preventing the upper edge of the portable electronic device from sliding beyond the third cover edge, and wherein the portable electronic device is inserted into the cover by sliding a back of the portable electronic device along the inside of the first cover panel until an upper edge of the portable electronic device is stopped by the first structure.

18. The method of claim 17 wherein the first structure is at a corner where the third cover edge intersects with the second cover edge.

* * * * *